US012734745B2

(12) United States Patent
Lee et al.

(10) Patent No.: US 12,734,745 B2
(45) Date of Patent: Sep. 15, 2026

(54) SUPPORT, BONDING DEVICE INCLUDING SUPPORT, AND METHOD OF MANUFACTURING DISPLAY DEVICE USING THE SAME

(71) Applicant: Samsung Display Co., LTD., Yongin-si (KR)

(72) Inventors: Jungkyu Lee, Incheon (KR); Youngsu Kim, Gunpo-si (KR); Jongdeok Park, Seoul (KR); Jaesuk Yoo, Seoul (KR); Jeong-Seop Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 18/764,798

(22) Filed: Jul. 5, 2024

(65) Prior Publication Data

US 2024/0365650 A1 Oct. 31, 2024

Related U.S. Application Data

(62) Division of application No. 17/188,744, filed on Mar. 1, 2021, now Pat. No. 12,052,906.

(30) Foreign Application Priority Data

Jun. 5, 2020 (KR) ........................ 10-2020-0068125

(51) Int. Cl.
*B29C 63/28* (2006.01)
*B29C 63/00* (2006.01)
(Continued)

(52) U.S. Cl.
CPC .......... *B29C 63/28* (2013.01); *B29C 63/0073* (2013.01); *B29C 66/81455* (2013.01);
(Continued)

(58) Field of Classification Search
CPC ........ B29C 66/81455; B29C 66/82421; B29C 66/342; B29C 66/836; B29C 66/832;
(Continued)

(56) References Cited

U.S. PATENT DOCUMENTS

2011/0146916 A1 6/2011 Zahnd et al.
2018/0093464 A1 4/2018 Lee et al.
(Continued)

FOREIGN PATENT DOCUMENTS

KR 10-1578442 12/2015
KR 101706617 B1 * 2/2017 ....... G02F 1/133305
(Continued)

OTHER PUBLICATIONS

Machine translation of KR-20190096850-A date unknown.*
Machine translation of KR-101706617-B1 date unknown.*

*Primary Examiner* — John L Goff, II
(74) *Attorney, Agent, or Firm* — Lerner David LLP

(57) ABSTRACT

A bonding device includes a first panel support, a second panel support disposed below the first panel support, a diaphragm disposed on and extending along the first panel support, the diaphragm being disposed between the first panel support and the second panel support, and a window fixing chuck disposed on the diaphragm, the window fixing chuck including a groove facing the diaphragm. A through-hole extends from the second panel support to the first panel support, and the diaphragm is disposed on the through-hole.

5 Claims, 23 Drawing Sheets

(51) Int. Cl.

| | |
|---|---|
| ***B29C 65/00*** | (2006.01) |
| *B29L 31/34* | (2006.01) |
| *H10K 59/80* | (2023.01) |
| *H10K 71/00* | (2023.01) |

(52) U.S. Cl.
CPC .... *B29L 2031/3475* (2013.01); *H10K 59/871* (2023.02); *H10K 71/00* (2023.02)

(58) Field of Classification Search
CPC . B29C 66/8322; B29C 63/0073; B29C 63/16; B29C 63/0047; B29C 63/28; B29C 51/28; B29C 2043/3647; B29C 2043/3649; B29C 66/7465; Y10T 156/1028; H10K 71/00; H10K 71/50; B29L 2031/3475; B32B 17/10844; B32B 17/10853; B32B 37/003
USPC .......................................... 156/285, 87, 212
See application file for complete search history.

(56) References Cited

U.S. PATENT DOCUMENTS

| | | | |
|---|---|---|---|
| 2020/0009803 | A1 | 1/2020 | Kang et al. |
| 2020/0060028 | A1 | 2/2020 | Kim et al. |
| 2021/0384480 | A1 | 12/2021 | Lee et al. |

FOREIGN PATENT DOCUMENTS

| | | |
|---|---|---|
| KR | 10-1828833 | 3/2018 |
| KR | 10-1893101 | 8/2018 |
| KR | 10-2019-0096850 | 8/2019 |
| KR | 10-2020-0005708 | 1/2020 |
| KR | 10-2021-0150647 | 12/2021 |

* cited by examiner

SUPPORT, BONDING DEVICE INCLUDING SUPPORT, AND METHOD OF MANUFACTURING DISPLAY DEVICE USING THE SAME

CROSS-REFERENCE TO RELATED APPLICATION(S)

This is a divisional application of U.S. patent application Ser. No. 17/188,744 filed Mar. 1, 2021, now U.S. Pat. No. 12,052,906, the disclosure of which is incorporated herein by reference in its entirety. U.S. patent application Ser. No. 17/188,744 claims priority to and benefits of Korean Patent Application No. 10-2020-0068125 under 35 U.S.C. § 119, filed on Jun. 5, 2020, the entire contents of which are incorporated herein by reference.

BACKGROUND

1. Technical Field

The disclosure herein relates to a support, a bonding device including the support, and a method of manufacturing a display device using the same.

2. Description of the Related Art

An electronic device for providing an image to a user such as smartphones, digital cameras, laptop computers, navigation units, and smart televisions may include a display device for displaying an image. The display device may generate an image to provide the generated image to the user through a display screen.

In recent years, through the course of the development of technologies of the display device, various types of display devices have been developed. For example, a display device capable of displaying an image on a rear surface and a side surface as well as a front surface thereof has been developed.

The display device may include a display panel for displaying an image and a window disposed on the display panel to protect the display panel. The display panel and the window may be molded to be disposed on the front surface, the rear surface, and the side surface of the display device in order to display an image on the front surface, the rear surface, and the side surface of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a support capable of preventing a bonding failure between a display panel and a window, a bonding device including the support, and a method of manufacturing a display device using the same.

An embodiment provides a bonding device that may include a first panel support; a second panel support disposed below the first panel support; a diaphragm disposed on and extending along the first panel support, the diaphragm being disposed between the first panel support and the second panel support; and a window fixing chuck disposed on the diaphragm, the window fixing chuck including a groove facing the diaphragm. A through-hole may extend from the second panel support to the first panel support, and the diaphragm may be disposed on the through-hole.

A thickness of the diaphragm may gradually decrease from an upper end of the first panel support to a portion between the first panel support and the second panel support.

The second panel support may have a plate shape and extend in a third direction intersecting a plane defined by a first direction and a second direction intersecting the first direction, the plate shape being defined by the first direction and the third direction, and the first panel support and the groove may extend in the first direction.

The diaphragm may not be disposed on side surfaces of the second panel support, the side surfaces of the second panel support may be opposite to each other in the first direction and the second direction.

The panel support and the diaphragm may be disposed in the groove of the window fixing chuck upon the window fixing chuck or the panel support being moved in the third direction.

The diaphragm may overlap the first panel support, and the first panel support may include a curved surface convex in an upward direction corresponding to the third direction, and the window fixing chuck may include a concave curved surface at an inner end of the groove of the window fixing chuck facing the curved surface of the first panel support.

The first panel support may have a maximum width greater than a width of the second panel support based on the second direction.

The diaphragm may include a first portion disposed on the curved surface of the first panel support; and a second portion disposed between the first panel support and the second panel support.

The first portion of the diaphragm may be disposed on the through-hole extending from the second panel support to the first panel support and expanded by air injected through the through-hole, and the second portion of the diaphragm may not overlap the through-hole.

The bonding device may further include a fastening unit that may fasten the second panel support to the first panel support and that may not overlap the through hole.

The fastening unit may pass through the second panel support and the second portion of the diaphragm and may be inserted into the first panel support.

The fastening unit may passed through the second panel support, may be inserted into the first panel support, and may not pass through the second portion of the diaphragm.

The through-hole may extend from an upper end of the first panel support in the first direction.

The first panel support may have a maximum width equal to a width of the second panel support based on the second direction.

The first and second panel supports may be integral, and the diaphragm may be bonded to a portion between the first panel support and the second panel support.

The through-hole may include a plurality of first through-holes formed in the first panel support; and a second through-hole formed in the second panel support, wherein lower portions of the plurality of first through-holes may form an integrated space to overlap the second through-hole.

A thickness of the diaphragm may be constant from an upper end of the first panel support to a portion between the first panel support and the second panel support.

In an embodiment, a method of manufacturing a display device may include disposing a display panel on a diaphragm that overlaps an upper portion of a panel support and side surfaces of the panel support; disposing a window in a groove of a window fixing chuck, the window fixing chuck being disposed above the diaphragm; disposing the panel support and the diaphragm in the groove of the window fixing chuck; bonding a first bent portion of the display panel disposed on the diaphragm to a second bent portion of the window adjacent to the first bent portion of the display panel by expanding the diaphragm; and bonding first flat portions of the display panel disposed on the side surfaces of the panel support to second flat portions of the window adjacent to the first flat portions of the display panel by moving the expanded diaphragm to be spaced apart from the first bent portion of the display panel along the groove of the window fixing chuck.

The method may further include expanding the diaphragm by air injected through a through-hole formed in the panel support.

A first pneumatic pressure supplied to the diaphragm when the first bent portion of the display panel may be bonded to the second bent portion of the window may be greater than a second pneumatic pressure supplied to the diaphragm when the first flat portions of the display panel may be bonded to the second flat portions of the window.

The panel support may include a first panel support; and a second panel support disposed below the first panel support, wherein the diaphragm may be disposed on the first panel support and extend along the first panel support, the diaphragm may be disposed between the first panel support and the second panel support, and the through-hole may extend from the second panel support to the first panel support, and the diaphragm may be disposed on the through-hole formed in the first panel support.

The diaphragm may not be disposed on side surfaces of the second panel support, and a thickness of the diaphragm may gradually decrease from an upper end of the first panel support to a portion between the first panel support and the second panel support.

In an embodiment, a support may include a first panel support; a second panel support disposed below the first panel support; and a diaphragm disposed on the first panel support and extending along the first panel support, the diaphragm being disposed between the first panel support and the second panel support. The diaphragm may not be disposed on side surfaces of the second panel support, and the diaphragm may be expanded by air injected through a through-hole extending from the second panel support to the first panel support.

A thickness of the diaphragm may gradually decrease from an upper end of the first panel support to a portion between the first panel support and the second panel support.

BRIEF DESCRIPTION OF THE DRAWINGS

The accompanying drawings are included to provide a further understanding, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
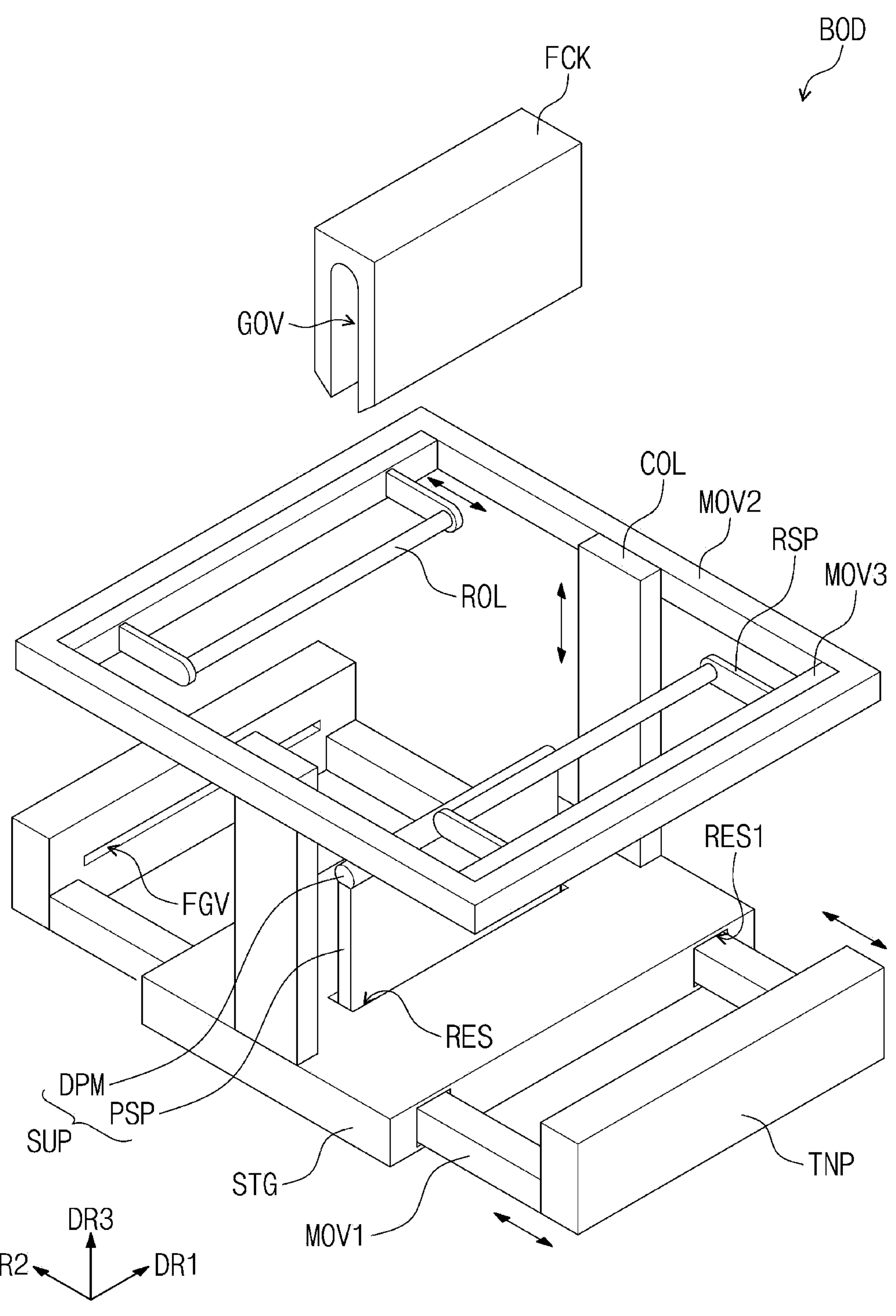
FIG. 1 is a perspective view illustrating a bonding device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the term “and/or” includes any and all combinations of one or more of the associated listed items. Throughout the disclosure, the expression “at least one of a, b or c” indicates only a, only b, only c, both a and b, both a and c, both b and c, all of a, b, and c, or variations thereof.

The terms “and” and “or” may be used in the conjunctive or disjunctive sense and may be understood to be equivalent to “and/or.” In the specification and the claims, the phrase “at least one of” is intended to include the meaning of “at least one selected from the group of” for the purpose of its meaning and interpretation. For example, “at least one of A and B” may be understood to mean “A, B, or A and B.

In this specification, it will also be understood that when one component (or region, layer, portion) is referred to as being ‘on’, ‘connected to’, or ‘coupled to’ another component, it can be directly disposed/connected/coupled on/to the one component, or an intervening third or other component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

As used herein, the term "unit" denotes a structure or element as illustrated in the drawings and as described in the specification. However, the disclosure is not limited thereto. The term "unit" is not to be limited to that which is illustrated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' or "have" and their variations specifies a property, a fixed number, a step, an operation, an element, a component or a combination thereof, but does not exclude other properties, fixed numbers, steps, operations, elements, components or combinations thereof.

Hereinafter, embodiments will be described in detail with reference to the accompanying drawings.

FIG. 1 is a perspective view illustrating a bonding device according to an embodiment.

Referring to FIG. 1, a bonding device BOD according to an embodiment may include: a stage STG, a support SUP, columns COL, tension parts TNP, first moving parts MOV1, a second moving part MOV2, third moving parts MOV3, rollers ROL, roller supports RSP, and a window fixing chuck FCK.

The stage STG may have a plane defined by a first direction DR1 and a second direction DR2 crossing or intersecting the first direction DR1. The columns COL may be disposed on both sides of the stage STG, which are opposite to each other in the first direction DR1, and each extend in a third direction DR3. The columns COL may face each other in the first direction DR1.

The third direction DR3 may be defined as a direction that crosses or intersects the plane defined by the first and second directions DR1 and DR2 in a substantially perpendicular manner. Hereinafter, in this specification, spatially relative terms, such as "above", "on", "below", "upper direction" "lower direction" and the like, may represent a relative position and direction of components with respect to the third direction DR3.

The support SUP may be disposed on the stage STG. The support SUP may be disposed between the columns COL. The support SUP may have a lower portion disposed in a recess RES defined or formed in the stage STG.

The support SUP may have a plane defined by the first direction DR1 and the third direction DR3. The support SUP may include a panel support PSP and a diaphragm DPM. The panel support PSP may have a substantially plate shape defined by the first direction DR1 and the third direction DR3. The panel support PSP may have a lower portion disposed in the recess RES. The panel support PSP may be a rigid type and include stainless steel.

The diaphragm DPM may extend in the first direction DR1. The diaphragm DPM may be disposed on an upper portion of the panel support PSP. The diaphragm DPM may cover or overlap the upper portion of the panel support PSP. The diaphragm DPM may include a material having an elastic property and expanded by an external force. For example, the diaphragm DPM may include silicon.

The tension parts TNP may face both sides of the stage STG, which are opposite to each other in the second direction DR2. The tension parts TNP may each extend in the first direction DR1. Fixing grooves FGV may be defined or formed on inner surfaces of the tension parts TNP that face each other in the second direction DR2.

The first moving parts MOV1 may be disposed between the tension parts TNP and the both sides of the stage STG, which are opposite to each other in the second direction DR2. The first moving parts MOV1 may be inserted to recesses RES1 defined or formed at both sides of the stage STG, which are opposite to each other in the second direction DR2 and be moved in the second direction DR2. The first moving parts MOV1 may be connected to the tension parts TNP and move the tension parts TNP in the second direction DR2.

Although not shown, driving units for driving the first moving parts MOV1 may be disposed in the stage STG. However, an embodiment is not limited to the position of the driving units.

The second moving part MOV2 may have a substantially frame shape. For example, although the second moving part MOV2 may have a substantially rectangular substantially frame shape, an embodiment is not limited to the shape of the second moving part MOV2. The second moving parts MOV2 may be connected to the columns COL. The second moving parts MOV2 may be connected to outer side surfaces of the columns COL, which are opposite to inner side surfaces, which face each other, of the columns COL. The second moving parts MOV2 may be moved in the third direction DR3.

Although not shown, driving units for driving the second moving parts MOV2 may be disposed in the columns COL. However, an embodiment is not limited to the position of the driving units.

The third moving parts MOV3 may each extend in the first direction DR1 and face each other in the second direction DR2. The third moving parts MOV3 may be connected to inner side surfaces of the second moving part MOV2, which face each other in the first direction DR1. The third moving parts MOV3 may be disposed adjacent to the inner side surfaces of the second moving part MOV2, which face each other in the first direction DR1. The third moving parts MOV3 may be moved in the second direction DR2.

Although not shown, driving units for driving the third moving parts MOV3 may be disposed in the second moving part MOV2. However, an embodiment is not limited to the position of the driving units.

The roller supports RSP may each extend in the second direction DR2. The roller supports RSP may be connected to the third moving parts MOV3. The roller supports RSP connected to each of the third moving parts MOV3 may be arranged or disposed in the first direction DR1.

Each of the rollers ROL may be disposed between the roller supports RSP connected to each of the third moving parts MOV3 and connected to the roller supports RSP. Each of the rollers ROL may have a substantially cylindrical shape extending in the first direction DR1. The rollers ROL may face each other in the second direction DR2. The rollers ROL may be moved in the second direction DR2 by the third moving parts MOV3 and in the third direction DR3 by the second moving part MOV2.

The rollers ROL may be connected to the roller supports RSP to rotate. For example, the rollers ROL may rotate with respect to a rotation axis parallel to the first direction DR1. The rollers ROL may be moved in the second direction DR2 along the roller supports RSP.

The window fixing chuck FCK may be disposed higher than the support SUP. A groove GOV extending in the first direction DR1 may be defined or formed in the window fixing chuck FCK. The groove GOV may have an inner end having a substantially concave shape.

Figure 2:
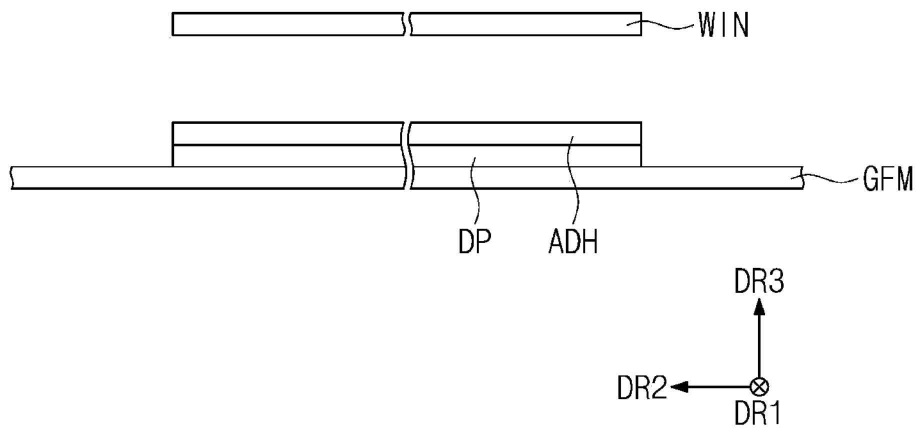
FIG. 2 is a view illustrating a display panel and a window, which are bonded to each other through the bonding device in FIG. 1.

FIG. 2 is a view illustrating a display panel and a window, which are bonded to each other through the bonding device in FIG. 1.

FIG. 2 illustrates side surfaces of a display panel DP and a window WIN when viewed in the first direction DR1.

Referring to FIG. 2, the display panel DP to be bonded to the window WIN may be disposed on the support SUP, and the window WIN may be disposed in the groove GOV of the window fixing chuck FCK in the bonding device BOD. A shape of the display panel DP disposed on the support SUP and a shape of the window WIN disposed in the groove GOV of the window fixing chuck FCK will be illustrated in FIG. 9 below.

The display panel DP may be disposed on the support SUP through a guide film GFM instead of being disposed directly on the support SUP. For example, the guide film GFM may be prepared, and then the display panel DP may be disposed on the guide film GFM. The guide film GFM may be disposed on the support SUP.

The guide film GFM may include a flexible plastic material. For example, the guide film GFM may include a plastic material such as polyimide (PI) or polyethyleneterephthalate (PET).

The display panel DP may be a flexible display panel. The display panel DP according to an embodiment may be a light emitting display panel. However, an embodiment is not particularly limited thereto. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot or a quantum rod. Thus, the display panel DP will be described as the organic light emitting display panel.

The window WM may be disposed on the display panel DP. The window WM may include glass. The window WIN may be defined or formed as an ultra thin glass (UTG). The ultra thin glass, as tempered glass, may have strong durability that may not be broken although bent.

The window WIN may include a synthetic resin film in addition to glass. Also, the window WIN may have a multi-layer or single-layer structure. For example, the window WIN may include synthetic resin films coupled or connected or adhered or attached by an adhesive or a glass substrate and a synthetic resin film, which may be coupled or connected or adhered or attached by an adhesive.

An adhesive ADH may be disposed between the display panel DP and the window WIN. Although the adhesive ADH may include an optically clear adhesive (OCA), an embodiment is not limited thereto.

The adhesive ADH may be firstly disposed on a top surface of the display panel DP. The adhesive ADH may be firstly bonded to the top surface of the display panel DP, and then the window WIN may be bonded to the adhesive ADH. The display panel DP and the window WIN may be bonded to each other by the adhesive ADH. The bonding device BOD in FIG. 1 may be used to bond the display panel DP and the window WIN to each other.

The display panel DP and the window WIN may be bonded to each other, and then the guide film GFM may be separated from the display panel DP. Although not shown, an adhesive for bonding the guide film GFM to the display panel DP may be disposed between the guide film GFM and the display panel DP. The window WIN bonded to the display panel DP may protect the display panel DP from external scratches and impacts.

Although not shown, an input sensing part for sensing an external input and an anti-reflection layer for preventing reflection of external light may be disposed between the display panel DP and the window WIN.

Figure 3:
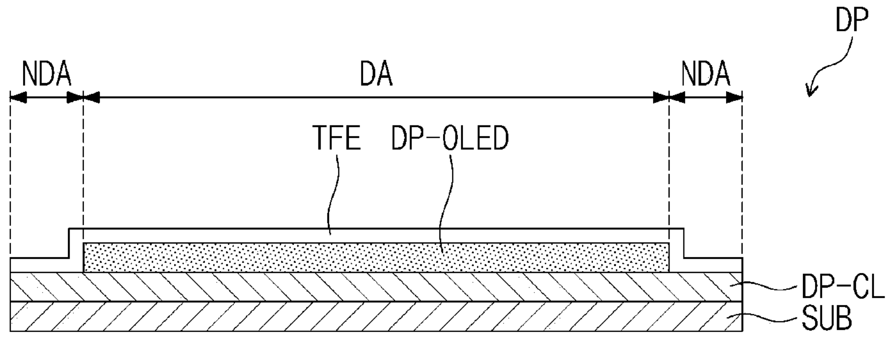
FIG. 3 is a schematic cross-sectional view illustrating a display panel in FIG. 2.
Figure 4:
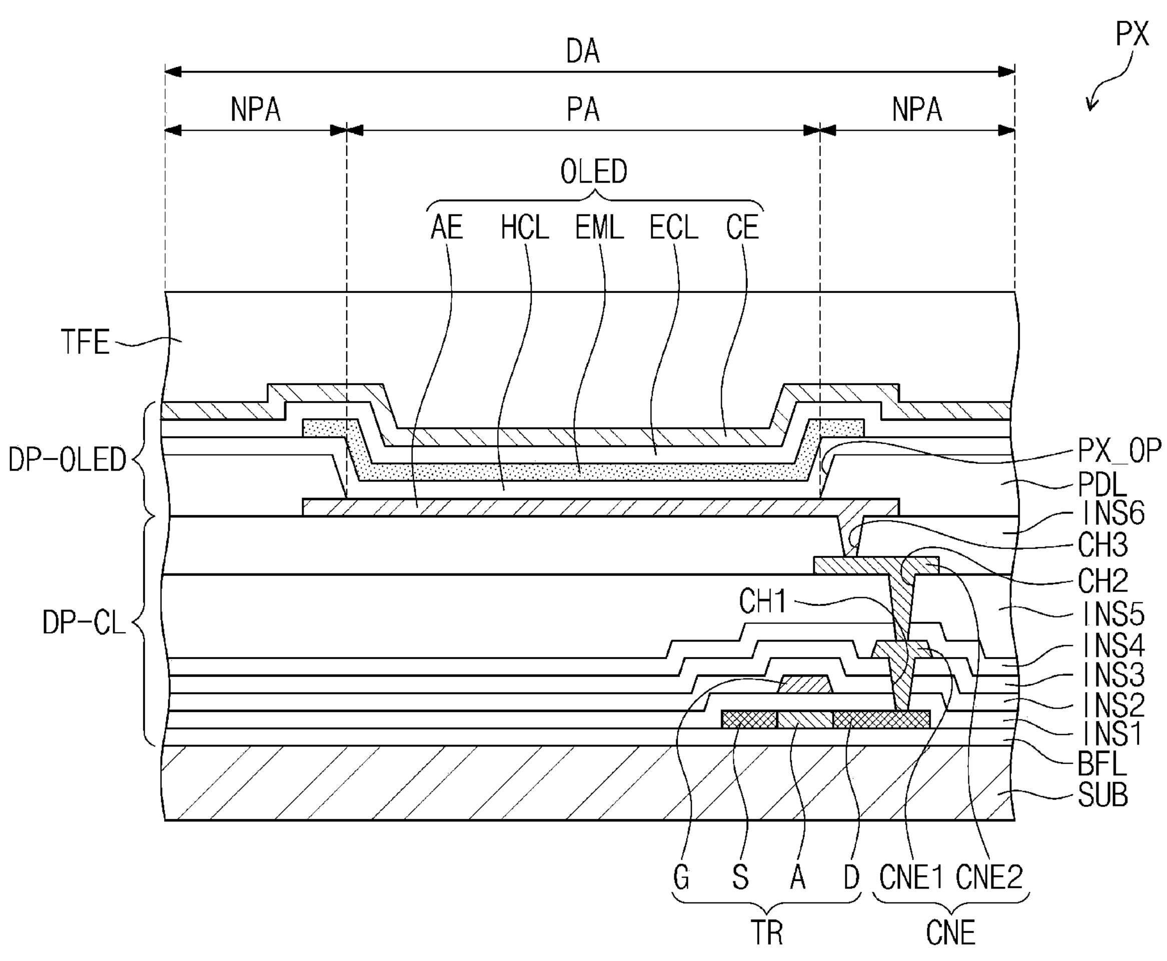
FIG. 4 is a view illustrating a schematic cross-section of one or a pixel disposed on a display element layer and a circuit element layer in FIG. 3.

FIG. 3 is a view illustrating a cross-section of the display panel in FIG. 2. FIG. 4 is a view illustrating a cross-section of one or a pixel disposed on a display element layer and a circuit element layer in FIG. 3.

Referring to FIG. 3, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display area DA and a non-display area NDA disposed around the display area DA. The substrate SUB may include a flexible plastic material such as polyimide (PI). The display element layer DP-OLED may be disposed on the display area DA.

Pixels may be disposed on the circuit element layer DP-CL and the display element layer DP-OLED. Each of the pixels may include a transistor disposed on the circuit element layer DP-CL and a light emitting element disposed on the display element layer DP-OLED and electrically connected to the transistor.

The thin-film encapsulation layer TFE may be disposed on the circuit element layer DP-CL to cover or overlap the display element layer DP-OLED. The thin-film encapsulation layer TFE may include inorganic layers and an organic layer disposed between the inorganic layers. The inorganic layers may protect the pixels from moisture/oxygen. The organic layer may protect the pixels from foreign substances such as dust particles.

Referring to FIG. 4, the pixel PX may include a transistor TR and a light emitting element OLED. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. Although one transistor TR is illustrated, the pixel PX may include transistors for driving the light emitting element OLED and at least one capacitor. The display area DA may include a light emitting area PA on which the light emitting element OLED may be disposed and a non-light emitting area NPA disposed around the light emitting area PA.

A buffer layer BFL may be disposed on the substrate SUB, and the buffer layer BFL may be an inorganic layer. A semiconductor pattern may be disposed on the buffer layer BFL. The semiconductor pattern may include polysilicon. However, an embodiment is not limited thereto. For example, the semiconductor pattern may include amorphous silicon or a metal oxide.

The semiconductor pattern may have an electrical property that may be varied according to whether doped or not. The semiconductor pattern may include a doped area and a non-doped area. The doped area may be doped with an n-type dopant or a p-type dopant. The doped area may have conductivity greater than that of the non-doped area and may substantially serve as a source electrode and a drain electrode of the transistor TR. The non-doped area may substantially correspond to an active (or channel) of the transistor.

A source S, an active A and a drain D region or layer of the transistor TR may be provided from or may be included in the semiconductor pattern. A first insulation layer INS1 may be disposed on the semiconductor pattern. The gate G of the transistor TR may be disposed on the first insulation layer INS1.

A second insulation layer INS2 may be disposed on the gate G. A third insulation layer INS3 may be disposed on the second insulation layer INS2. A connection electrode CNE for electrically connecting the transistor TR and the light emitting element OLED may be disposed between the transistor TR and the light emitting element OLED. The connection electrode CNE may include a first connection electrode CNE1 and a second connection electrode CNE2 disposed on the first connection electrode CNE1.

The first connection electrode CNE1 may be disposed on the third insulation layer INS3 and electrically connected to the drain D through a first contact hole CH1 defined or formed in the first to third insulation layers INS1 to INS3. A fourth insulation layer INS4 may be disposed on the first connection electrode CNE1. A fifth insulation layer INS5 may be disposed on the fourth insulation layer INS4. The second connection electrode CNE2 may be disposed on the fifth insulation layer INS5. The second connection electrode CNE2 may be electrically connected to the first connection electrode CNE1 through a second contact hole CH2 defined or formed in the fifth insulation layer INS5.

The second connection electrode CNE2 may be disposed on a sixth insulation layer INS6. Layers from the buffer layer BFL to the sixth insulation layer INS6 may be defined or formed as the circuit element layer DP-CL. Each of the first insulation layer INS1 to the sixth insulation layer INS6 may be an inorganic layer or an organic layer.

The first electrode AE may be disposed on the sixth insulation layer INS6. The first electrode AE may be electrically connected to the second connection electrode CNE2 through a third contact hole CH3 defined or formed in the sixth insulation layer INS6. A pixel defining layer PDL for exposing a predetermined portion of the first electrode AE may be disposed on the first electrode AE and the sixth insulation layer INS6. An opening PX_OP for exposing a predetermined portion of the first electrode AE may be defined or formed in the pixel defining layer PDL.

The hole control layer HCL may be disposed on the first electrode AE and the pixel defining layer PDL. The hole control layer HCL may be disposed on the light emitting area PA and the non-light emitting area NPA in common. The hole control layer HCL may include a hole transport layer and a hole injection layer.

The light emitting layer EML may be disposed on the hole control layer HCL. The light emitting layer EML may be disposed on an area corresponding to the opening PX_OP. The light emitting layer EML may include an organic material and/or an inorganic material. The light emitting layer EML may generate one of red light, green light, and blue light.

The electron control layer ECL may be disposed on the light emitting layer EML and the hole control layer HCL. The electron control layer ECL may be disposed on the light emitting area PA and the non-light emitting area NPA in common. The electron control layer ECL may include an electron transport layer and an electron injection layer.

The second electrode CE may be disposed on the electron control layer ECL. The second electrode CE may be disposed on the pixels in common. The thin-film encapsulation layer TFE may be disposed on the light emitting element OLED. A layer on which the light emitting element OLED may be disposed may be defined or formed as the display element layer DP-OLED.

A first voltage may be applied to the first electrode AE through the transistor TR, and a second voltage may be applied to the second electrode CE. Here, a hole and an electron, which may be injected to the light emitting layer EML, may be coupled to each other to provide an exciton, and, while the exciton may be transferred to a ground state, the light emitting element OLED may emit light.

Figure 5:
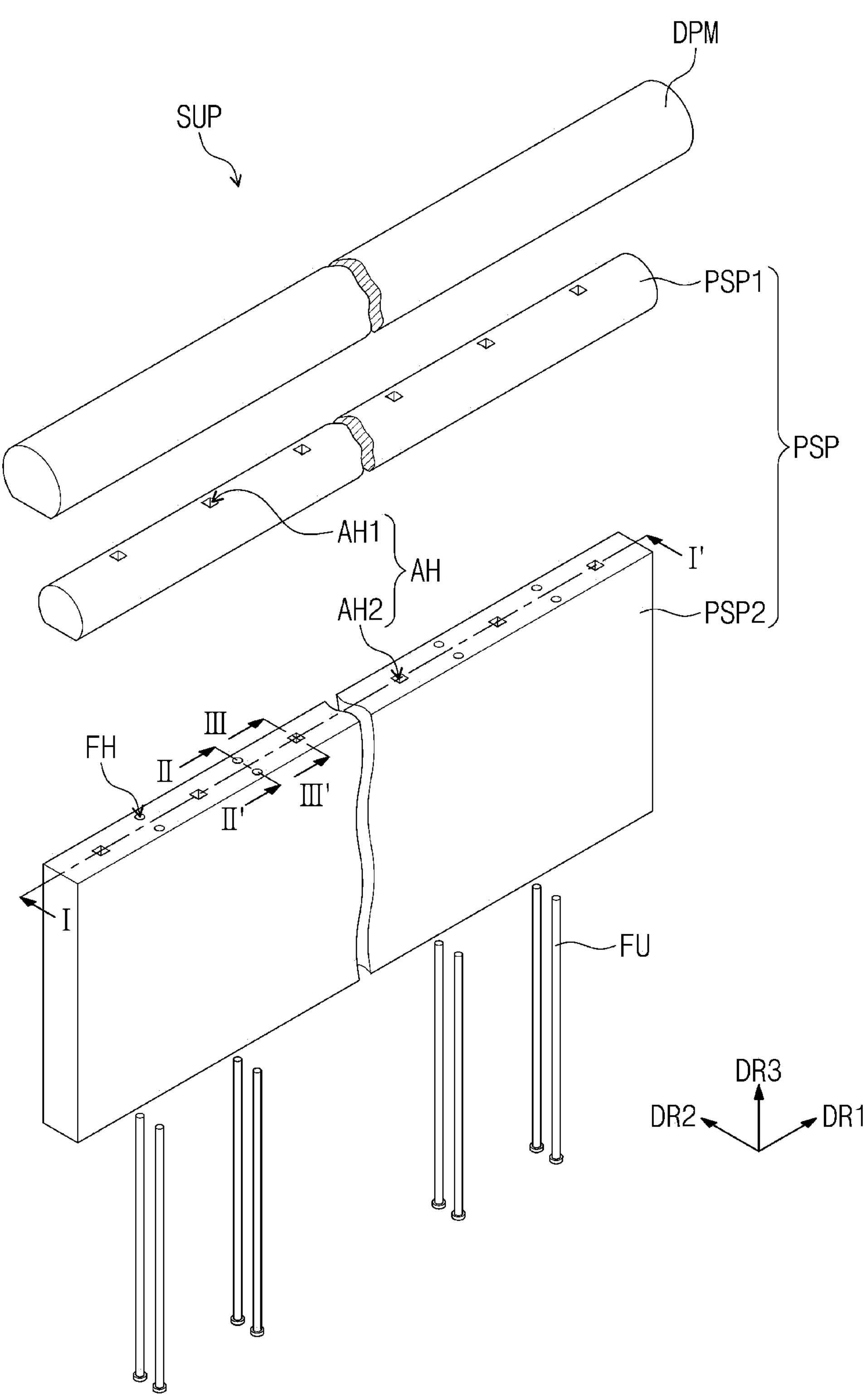
FIG. 5 is an exploded perspective view illustrating a support in FIG. 1.

FIG. 5 is an exploded perspective view illustrating the support in FIG. 1.

Referring to FIG. 5, the support SUP may include a panel support PSP, a diaphragm DPM disposed on the panel support PSP, and fastening units FU that may fasten the panel support PSP and the diaphragm DPM. The panel support PSP may include a first panel support PSP1 and a second panel support PSP2 disposed below the first panel support PSP1. The diaphragm DPM may be disposed on the first panel support PSP1.

The first panel support PSP1 may extend in the first direction DR1. When viewed from the first direction DR1, the first panel support PSP1 may have a curved surface protruding in an upward direction. The upward direction may correspond to the third direction DR3.

The second panel support PSP2 may extend in the third direction DR3. The second panel support PSP2 may have a substantially plate shape defined or formed by the first direction DR1 and the third direction DR3. The second panel support PSP2 may have a substantially rectangular shape extending further in the first direction DR1.

Through-holes AH arranged in the first direction DR1 may be defined or formed in the panel support PSP. The through-holes AH may include first through-holes AH1 defined or formed in the first panel support PSP1 and second through-holes AH2 defined or formed in the second panel support PSP2. The first through-holes AH1 may be arranged in the first direction DR1, and the second through-holes AH2 may be arranged in the first direction DR1.

For example, although each of the first and second through-holes AH1 and AH2 may have a substantially rectangular shape when viewed in the third direction DR3, an embodiment is not limited to the shape of each of the first and second through-holes AH1 and AH2.

Fastening holes FH arranged in the first direction DR1 may be defined or formed in the second panel support PSP2. In a case that the first direction DR1 may be defined or formed as a row direction, the fastening holes FH may be arranged in two rows. Although the fastening holes FH may be defined or formed in the second panel support PSP2 in terms of the perspective view, the fastening holes FH may be defined or formed even in the first panel support PSP1 and the diaphragm DPM. The above-described structure will be also illustrated in FIG. 7 below.

The fastening holes FH may not overlap the through-holes AH. When viewed in the second direction DR2, the fastening holes FH may be disposed between the through-holes AH. The fastening holes FH may be disposed closer to both side surfaces of the second panel support PSP2 than the through-holes AH. The both side surfaces of the second panel support PSP2 may be side surfaces of the second panel support PSP2, which are opposite to each other in the second direction DR2.

For example, each of the fastening holes FH may have a substantially circular shape when viewed in the third direction DR3. Each of the fastening units FU may have a substantially cylindrical shape extending in the third direction DR3. The fastening units FU may be disposed in the fastening holes FH. The fastening units FU disposed in the fastening holes FH will be illustrated in a schematic cross-sectional view of FIG. 7 below.

Figure 6:
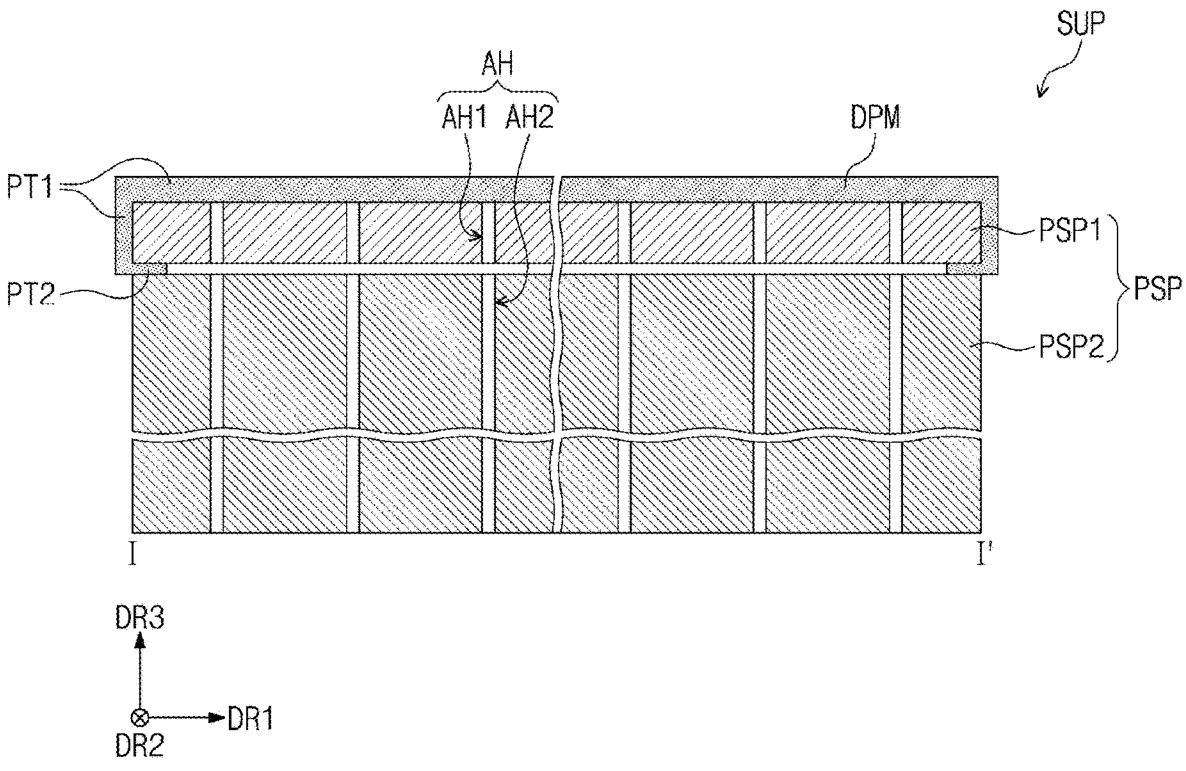
FIG. 6 is a schematic cross-sectional view taken along line I-I' of FIG. 5.

FIG. 6 is a schematic cross-sectional view taken along line I-I' of FIG. 5.

Also, cross-sections of the diaphragm DPM and the first panel support PSP1 are illustrated in the schematic cross-sectional view of FIG. 6.

Referring to FIG. 6, the through-holes AH may pass from the second panel support PSP2 to the first panel support PSP1. The through-holes AH may extend in the third direction DR3. When viewed in the third direction DR3, the first through-holes AH1 may overlap the second through-holes AH2.

The diaphragm DPM may be disposed on the first through-holes AH1. The diaphragm DPM may extend along the first panel support PSP1. The diaphragm DPM may cover or overlap the first panel support PSP1. For example, the diaphragm DPM may be disposed on a top surface of the first panel support PSP1 and both side surfaces of the first panel support PSP1, which are opposite to each other in the first direction DR1.

The diaphragm DPM may be a membrane structure having a small thickness and made of synthetic rubber, synthetic resin, or metal. The diaphragm DPM may have a property of being restored to an original shape with a predetermined elastic force. For example, the diaphragm DPM may be a partition plate of a thin membrane having elasticity.

The diaphragm DPM may extend between the first panel support PSP1 and the second panel support PSP2. The diaphragm DPM may have a lower portion that may be disposed and connected between the first panel support PSP1 and the second panel support PSP2. The diaphragm DPM may not be disposed on both side surfaces of the second panel support PSP2, which are opposite to each other in the first direction DR1.

Figure 7:
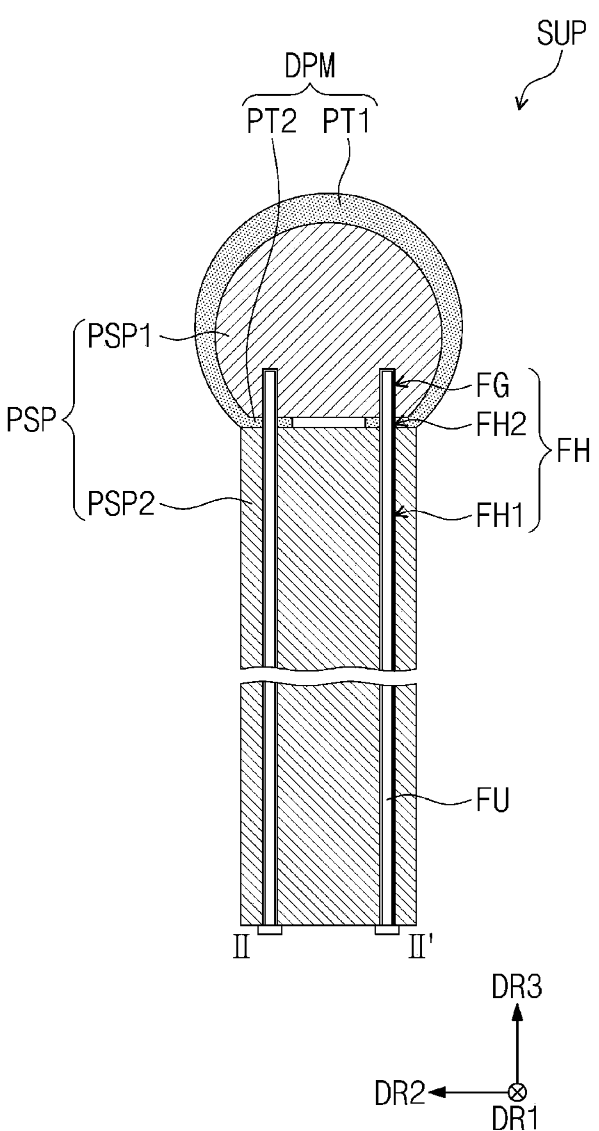
FIG. 7 is a schematic cross-sectional view taken along line II-II' of FIG. 5.

The diaphragm DPM may include a first portion PT1 disposed on the first panel support PSP1 and a second portion PT2 disposed between the first panel support PSP1 and the second panel support PSP2. The first portion PT1 may be disposed on the both side surfaces of the first panel support PSP1, which may be opposite to each other in the first direction DR1. The first portion PT1 may include a first outer surface OS1 as in FIG. 12. FIG. 7 is a schematic cross-sectional view taken along line II-II' of FIG. 5.

Hereinafter, FIG. 7 will be described in conjunction with FIG. 5 as necessary. Also, cross-sections of the diaphragm DPM and the first panel support PSP1 are illustrated in the schematic cross-sectional view of FIG. 7.

Referring to FIG. 7, when viewed in the first direction DR1, a bottom surface of the first panel support PSP1, which faces the second panel support PSP2, may be parallel to the second direction DR2. When viewed in the first direction DR1, the second panel support PSP2 may have a substantially rectangular shape extending further in the third direction DR3.

When viewed in the first direction DR1, an outer surface of the first panel support PSP1 except for the bottom surface of the first panel support PSP1 may have a curved surface convex in an upward direction. A maximum width of the first panel support PSP1 having the curved surface may be greater than that of the second panel support PSP2 in terms of or based on the second direction DR2.

Since the diaphragm DPM may be disposed on the outer surface of the first panel support PSP1 having the curved surface, the diaphragm DPM may also have a curved surface. The diaphragm DPM may have a thickness that gradually decreases from an upper end of the first panel support PSP1 to a portion between the first panel support PSP1 and the second panel support PSP2. However, an embodiment is not limited thereto. For example, the diaphragm DPM may have a constant thickness. Also, the diaphragm DPM may have various shapes and various thicknesses. The diaphragm DPM may not be disposed on side surfaces of the second panel support PSP2, which are opposite to each other in the second direction DR2.

The first portion PT1 may be disposed on the curved surface of the first panel support PSP1. The second portion PT2 may be connected and fixed between the first panel support PSP1 and the second panel support PSP2.

The fastening hole FH may include a fastening groove FG defined or formed in the first panel support PSP1, a first fastening hole FH1 defined or formed in the second panel support PSP2, and a second fastening hole FH2 defined or formed in the second portion PT2 of the diaphragm DPM. The fastening groove FG may be recessed by a predetermined portion in a direction from the bottom surface of the first panel support PSP1 to an upper portion of the first panel support PSP1. The first fastening hole FH1 may pass through the second panel support PSP2 in the third direction DR3. The second fastening hole FH2 may pass through the second portion PT2 in the third direction DR3.

Each of the fastening groove FG, the first fastening hole FH1, and the second fastening hole FH2 may extend to provide an integrated space or aperture or cavity. Thus, when viewed in the third direction DR3, the fastening groove FG, the first fastening hole FH1, and the second fastening hole FH2 may overlap each other.

The support SUP may include the fastening units FU. The fastening units FU may pass through the second panel support PSP2 and the second portion PT2 and be inserted to the first panel support PSP1. For example, the fastening units FU may be inserted to the second fastening hole FH2, the first fastening hole FH1, and the fastening groove FG.

The second panel support PSP2 may be fastened to the first panel support PSP1 by the fastening units FU. Also, the second portion PT2 may be connected and fixed between the first panel support PSP1 and the second panel support PSP2 by the fastening units FU.

Referring to FIGS. 5 and 7, since the fastening holes FH may not overlap the through-holes AH, the fastening units FU may not overlap the through-holes AH. Also, since the fastening units FU are disposed in the fastening holes FH, the fastening units FU may be disposed between the through-holes AH when viewed in the second direction DR2.

Figure 8:
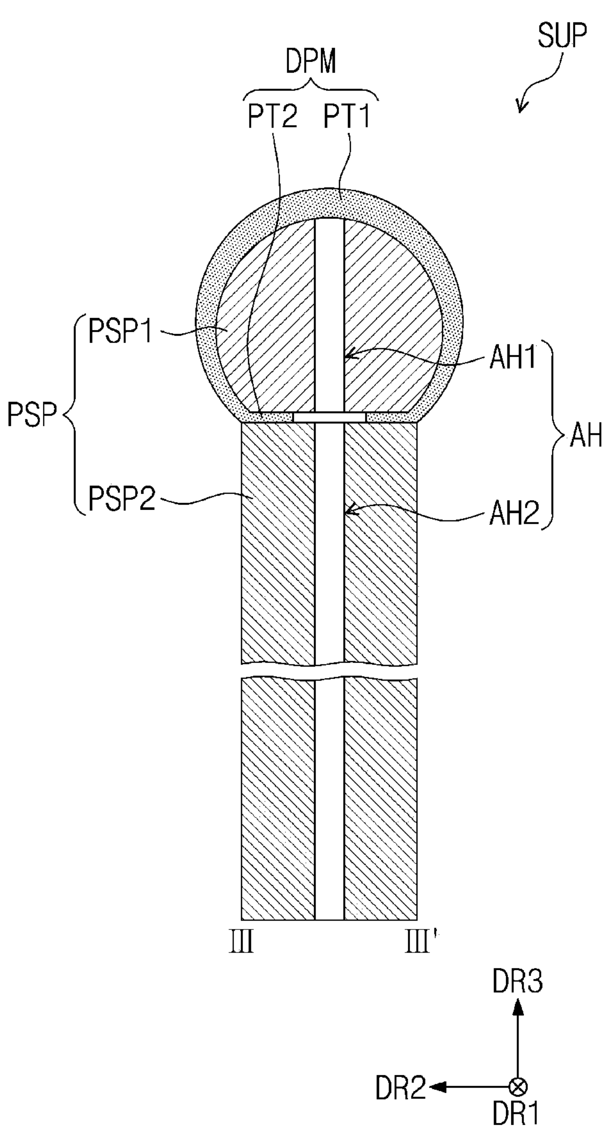
FIG. 8 is a schematic cross-sectional view taken along line III-III' of FIG. 5.

FIG. 8 is a schematic cross-sectional view taken along line III-III' of FIG. 5.

Hereinafter, FIG. 8 will be described in conjunction with FIG. 6 as necessary. Also, cross-sections of the diaphragm DPM and the first panel support PSP1 are illustrated in the schematic cross-sectional view of FIG. 7.

Referring to FIGS. 6 and 8, the through-holes AH may be opened through the upper end of the first panel support PSP1. For example, a first through-hole AH1 may be opened through the upper end of the first panel support PSP1. However, an embodiment is not limited thereto. For example, the first through-hole AH1 may be opened through various positions.

The first portion PT1 may be disposed on the first through-holes AH1. Air may be injected into the first portion PT1 through the through-holes AH. The above-described operation will be described below in detail.

Referring to FIGS. 6 and 8, the second portion PT2 may not overlap the through-holes AH. The air may be injected into the first through-holes AH1 through the second through-holes AH2. In a case that the second portion PT2 may overlap the through-holes AH, the air may be injected into the first through-holes AH1 through the second through-holes AH2 by the second portion PT2. Thus, in an embodiment, the second portion PT2 may not overlap the through-holes AH.

FIGS. 9 to 17 are views for explaining a method of manufacturing a display device using the bonding device in FIG. 1.

In FIGS. 9 to 17, the display panel DP and the guide film GFM are illustrated, and the adhesive ADH may be omitted.

Figure 9:
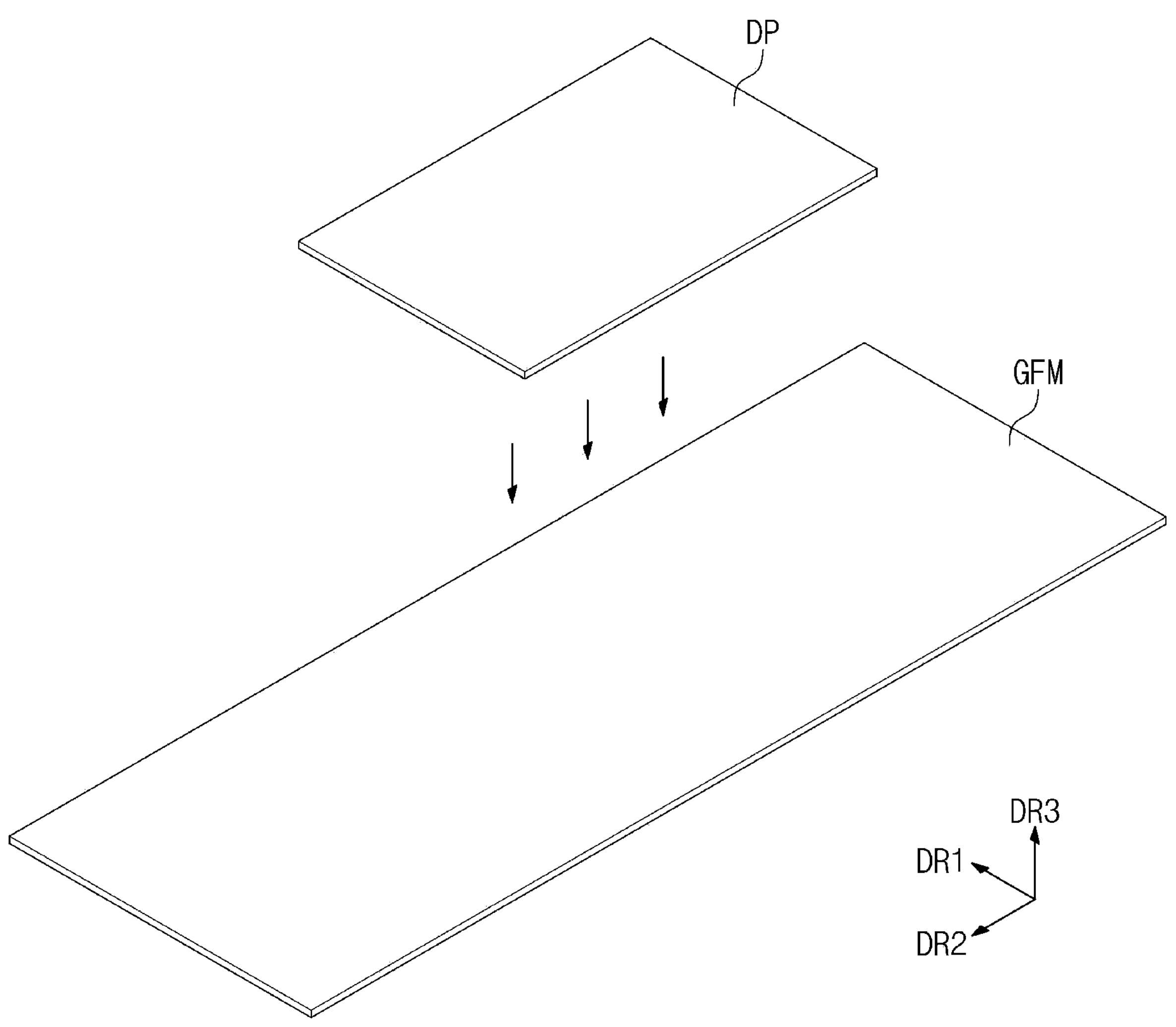
FIGS. 9 to 17 are views for illustrating a method of manufacturing a display device using the bonding device in FIG. 1.

Referring to FIG. 9, the guide film GFM may have a length greater than that of the display panel DP in the second direction DR2. The display panel DP may be disposed on the guide film GFM and bonded to the guide film GFM. A process of bonding the guide film GFM and the display panel DP may be performed in a first process chamber (not shown). Although not shown, the adhesive ADH may be disposed on the display panel DP. Also, an adhesive for bonding the display panel DP to the guide film GFM may be used.

The guide film GFM and the display panel DP, which are bonded to each other, may be transferred to a second process chamber (not shown). In the second process chamber, a process of bonding the window to the display panel DP may be performed. All of processes to be described below may be substantially performed in the second process chamber.

Figure 10:
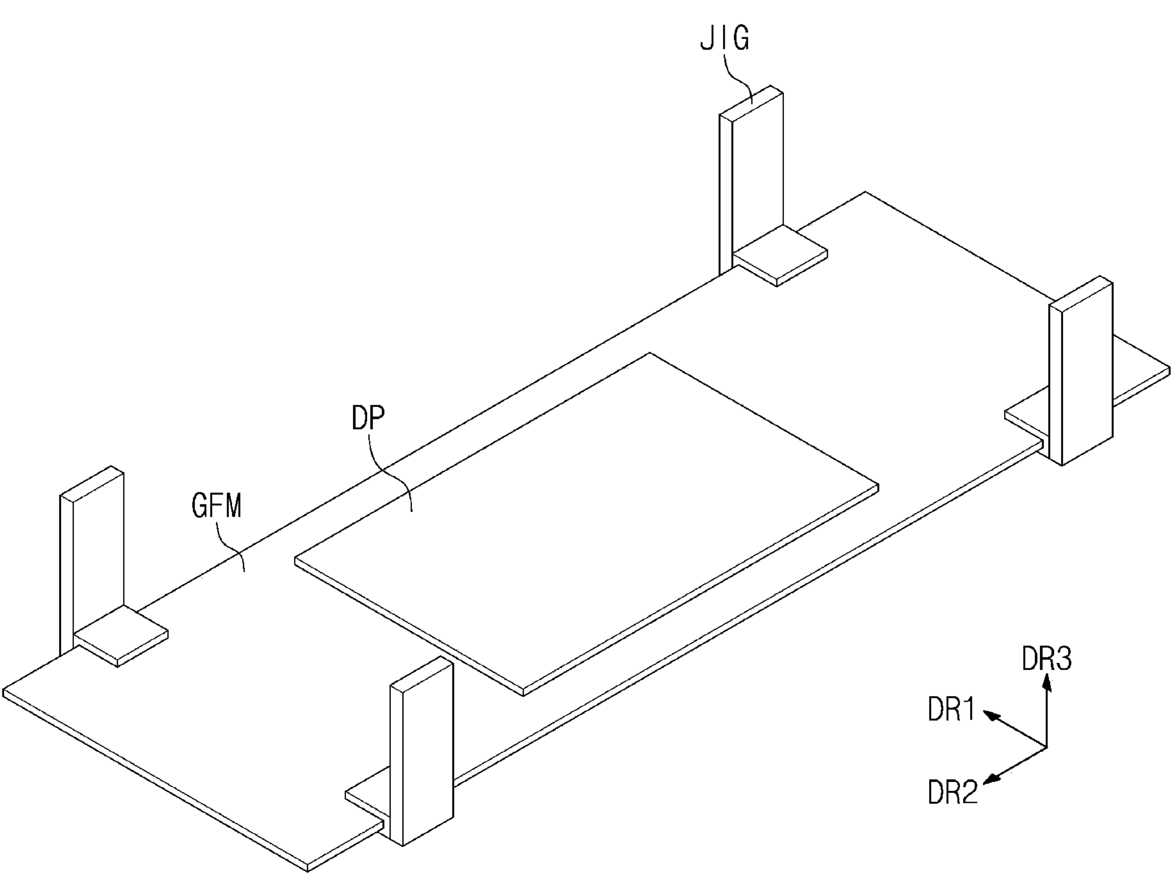

Referring to FIG. 10, jigs JIG may be provided and disposed on portions of the guide film GFM, which may be adjacent to both ends, which may be opposite to each other in the second direction DR2, of the guide film GFM. The jigs JIG may hold both ends of the guide film GFM, which are opposite to each other in the first direction DR1. The guide film GFM may be moved by the jigs JIG.

Figure 11:
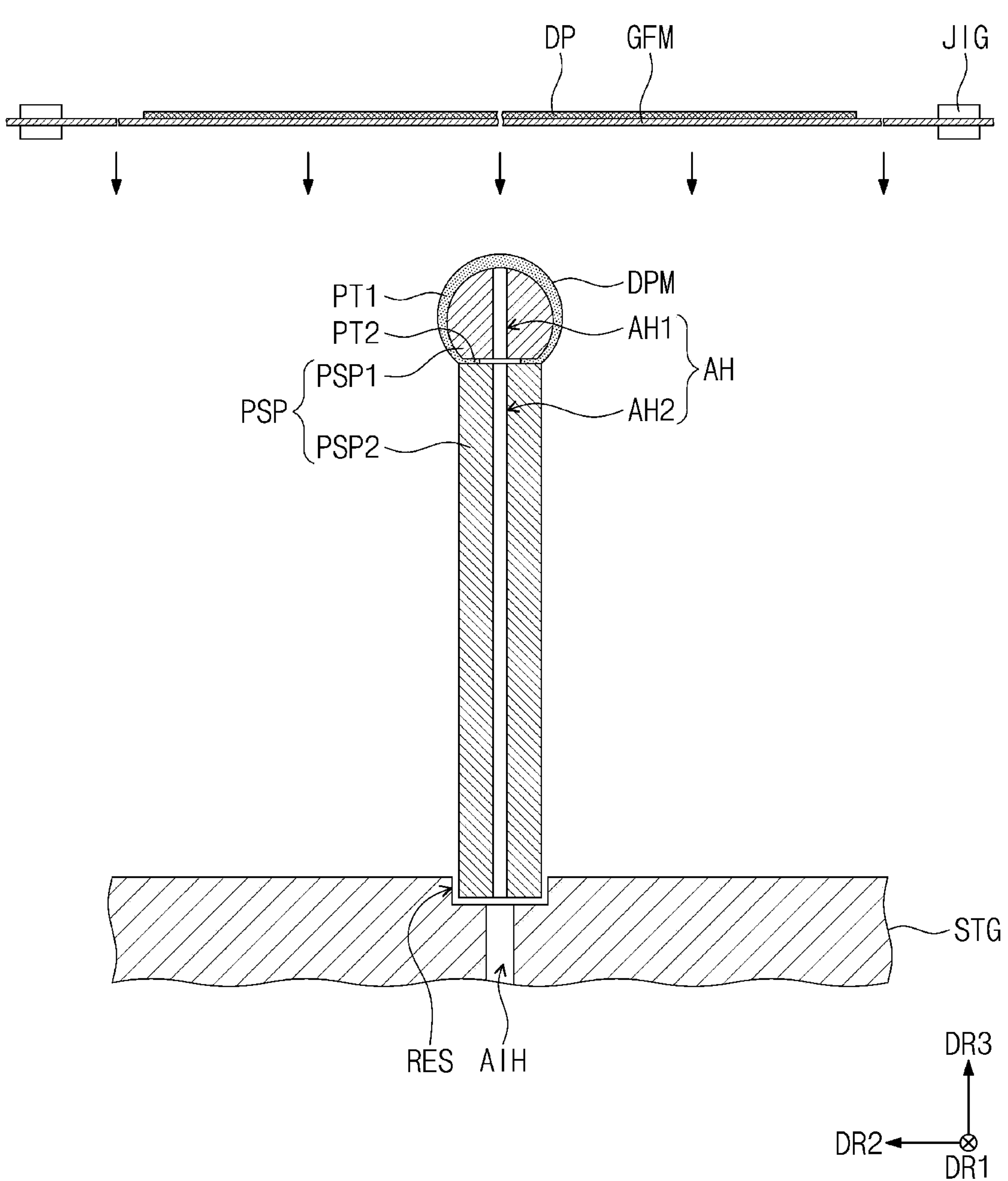

Referring to FIG. 11, the guide film GFM may be moved by the jigs JIG and disposed above the support SUP. The jigs JIG may be moved in a downward direction to provide the guide film GFM on the support SUP.

Figure 12:
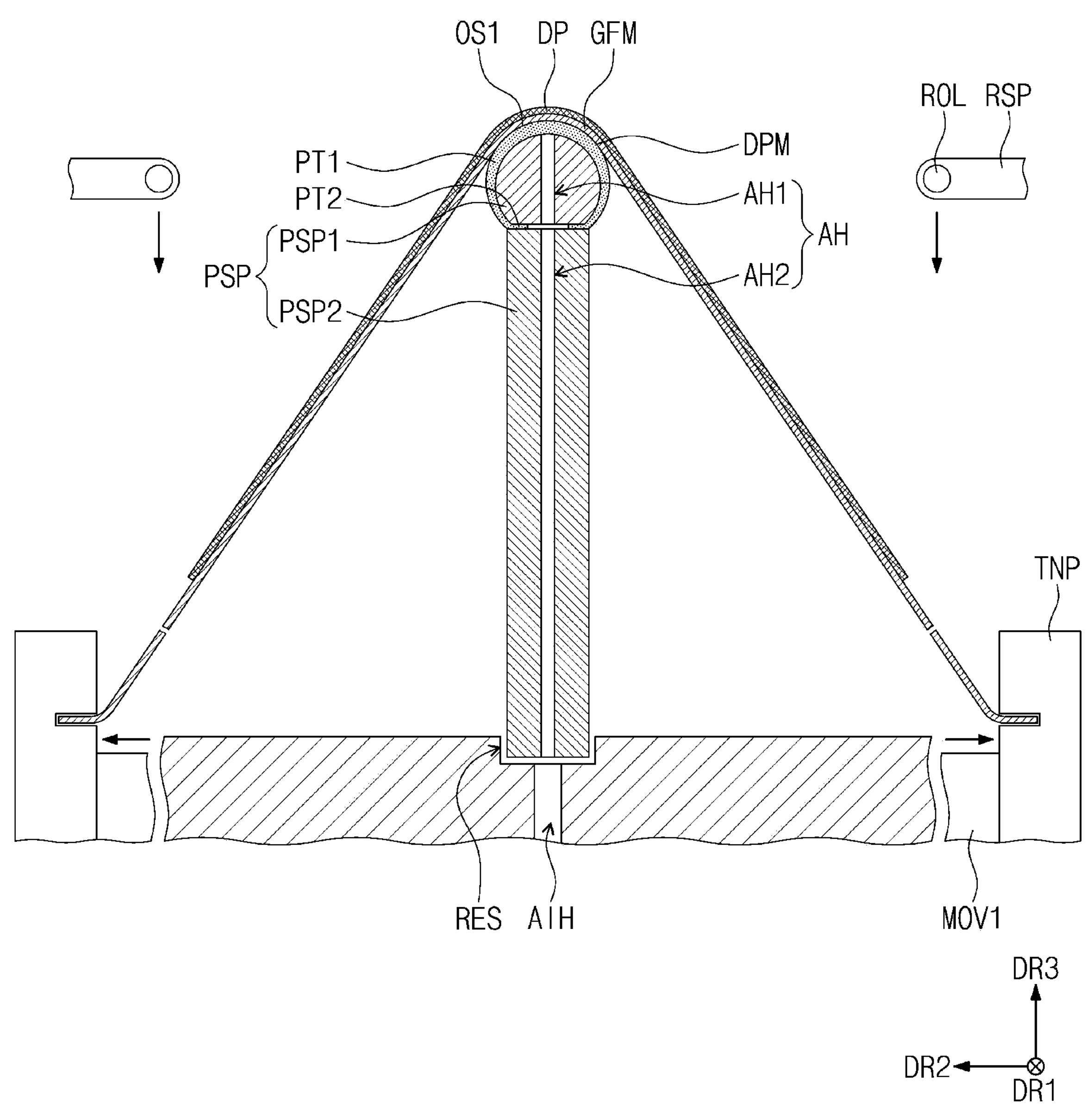

Referring to FIGS. 11 and 12, the guide film GFM may be moved in the downward direction by the jigs JIG, and a portion of the guide film GFM, which may overlap a central portion of the display panel DP, may be disposed on the diaphragm DPM. The portion of the guide film GFM, which may overlap the central portion of the display panel DP, may contact the diaphragm DPM.

The jigs JIG may move the both ends of the guide film GFM in the downward direction so that the both ends are disposed in fixing grooves FGV defined or formed in the tension parts TNP. Thereafter, the jigs JIG may be removed from the guide film GFM.

The both ends of the guide film GFM may be fixed to the fixing grooves FGV. Although not shown, fixing units (for example, screws for pressing the guide film) may be disposed in the fixing grooves FGV to fix the both ends of the guide film GFM. The tension parts TNP may be moved to be spaced apart from each other by the first moving parts MOV1 so that the guide film GFM may be unbent to be flat.

Figure 13:
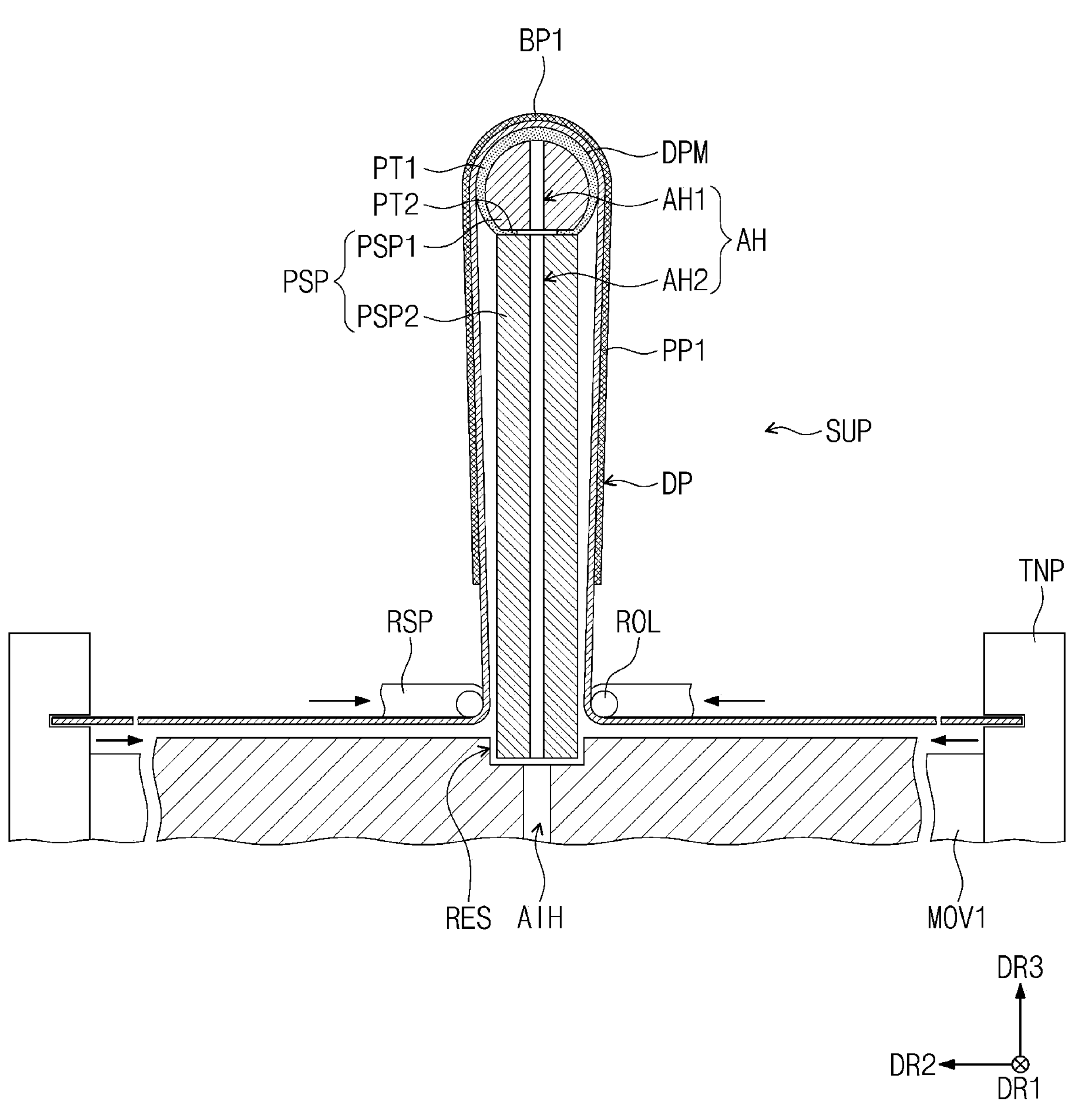

Referring to FIGS. 12 and 13, the rollers ROL may be moved in the second direction DR2 and the third direction DR3. As described above, the rollers ROL may be moved in the third direction DR3 by the second moving part MOV2 and moved in the second direction DR2 by the third moving parts MOV3.

The rollers ROL may contact the guide film GFM to move the guide film GFM. The rollers ROL may contact portions of the guide film GFM, which are adjacent to the display panel DP. The rollers ROL may be disposed adjacent to a lower end of the second panel support PSP2. The rollers ROL may be disposed adjacent to the side surfaces of the second panel support PSP2.

The guide film GFM may be disposed adjacent to the side surfaces of the second panel support PSP2 by the rollers ROL. Thus, the display panel DP may be disposed adjacent to the side surfaces of the second panel support PSP2 by the rollers ROL by the guide film GFM.

The guide film GFM may be disposed on the diaphragm DPM and the side surfaces of the panel support PSP, and the display panel DP may be disposed on the diaphragm DPM and the side surfaces of the panel support PSP by the guide film GFM. The display panel DP may be spaced upward from the rollers ROL. For example, the rollers ROL may guide the display panel DP to be disposed adjacent to the second panel support PSP2.

As the guide film GFM may be moved by the roller ROL, the tension parts TNP may be moved in conjunction with the rollers ROL. As the rollers ROL are moved to be adjacent to each other in a direction toward the support SUP, the tension parts TNP may be moved to be adjacent to each other in the second direction DR2 by the first moving parts MOV1.

Hereinafter, the tension parts TNP will be omitted from FIG. 14.

Figure 14:
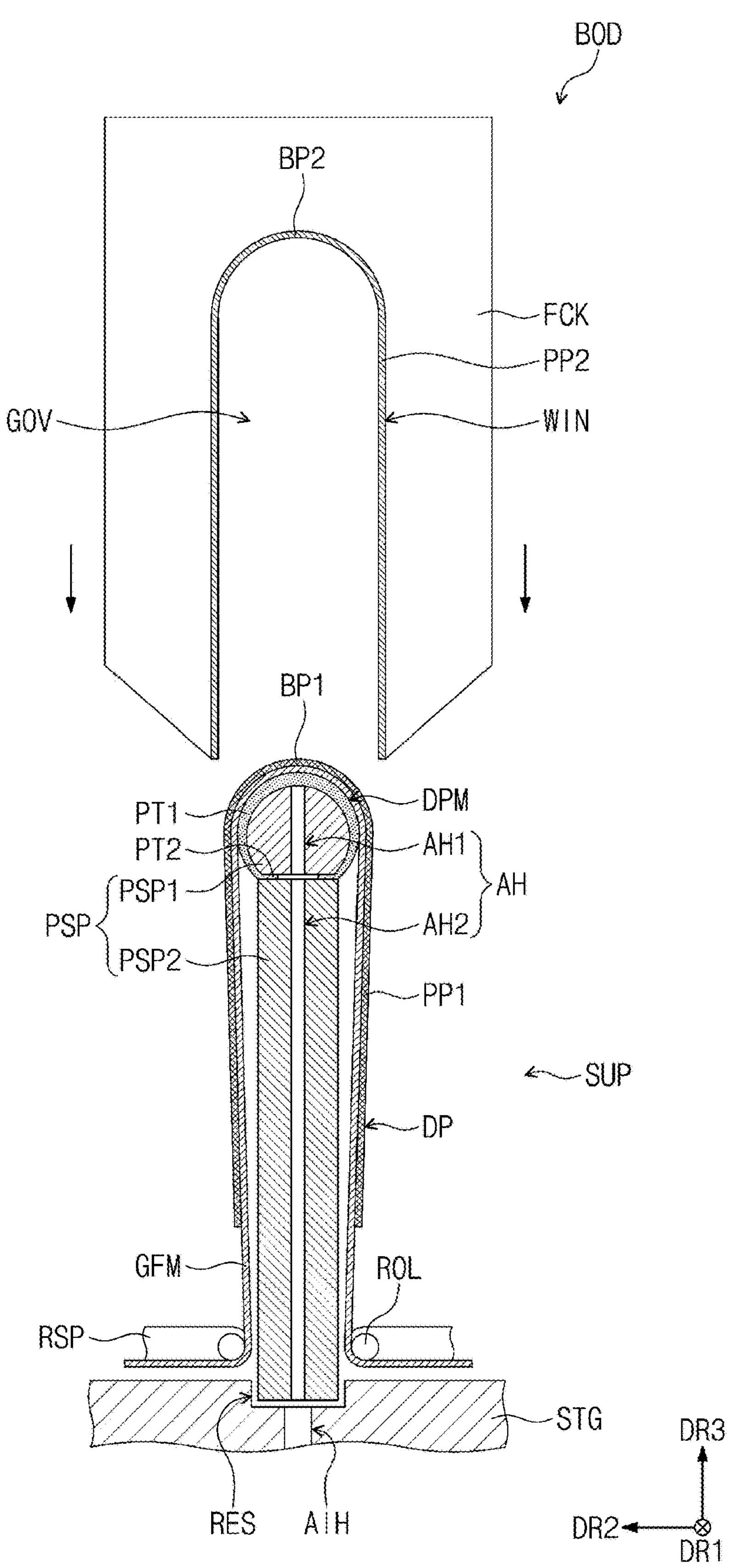

Referring to FIG. 14, the window fixing chuck FCK may be disposed above the support SUP. The window fixing chuck FCK may face the support SUP. For example, the stage STG may be moved to a position at which the window fixing chuck FCK may be disposed so that the window fixing chuck FCK may be disposed above the support SUP. The groove GOV defined or formed in the window fixing chuck FCK may face the support SUP. The inner end of the groove GOV, which faces the support SUP, may have a substantially concave shape.

The window WIN may be disposed in the groove GOV of the window fixing chuck FCK. The window WIN disposed in the groove GOV may have a substantially bent shape. Although not shown, vacuum adsorption holes for adsorbing and fixing the window WIN may be defined or formed in an inner surface of the window fixing chuck FCK, in which the groove GOV may be defined or formed.

The window fixing chuck FCK may be disposed above the diaphragm DPM. The groove GOV may face the diaphragm DPM. The window fixing chuck FCK may have a concave curved surface at the inner end of the groove GOV facing the curved surface of the first panel support PSP1.

In FIG. 14, the side surfaces of the panel support PSP may substantially indicate the side surfaces of the second panel support PSP2, which are opposite to each other in the second direction DR2. Although not shown in FIG. 14, the adhesive ADH may be disposed on the display panel DP.

As the display panel DP may be disposed along the first panel support PSP1 having the substantially curved surface and the second panel support PSP2 having the substantially plate shape extending in the third direction DR3, the display panel DP may have a substantially bent shape. The display panel DP may include a first bent portion BP1 and first flat portions PP1. The first bent portion BP1 may be disposed on the first panel support PSP1 having the curved surface and the diaphragm DPM. The first flat portions PP1 may be disposed on the side surfaces of the second panel support PSP2. The first bent portion BP1 may have a substantially bent shape, and each of the first flat portions PP1 may have a substantially flat shape. In a case that the display panel DP may be unbent, the first bent portion BP1 may be disposed between the first flat portions PP1.

The window WIN may include a second bent portion BP2 corresponding to the first bent portion BP1 and second flat portions PP2 corresponding to the first flat portions PP1. In a case that the window WIN may be unbent, the second bent portion BP2 may be disposed between the second flat portions PP2. The first bent portion BP1 may be bonded to the second bent portion BP2 by the bonding device BOD, and the first flat portions PP1 may be bonded to the second flat portions PP2. The above-described operation will be described below in detail.

The second panel support PSP2 may have a lower end disposed in the recess RES of the stage STG. An air injection hole AIH extending in the third direction DR3 may be defined or formed in a portion of the stage STG, in which the recess RES may be defined or formed. When viewed in the third direction DR3, the air injection hole AIH may overlap the through-hole AH.

Figure 15:
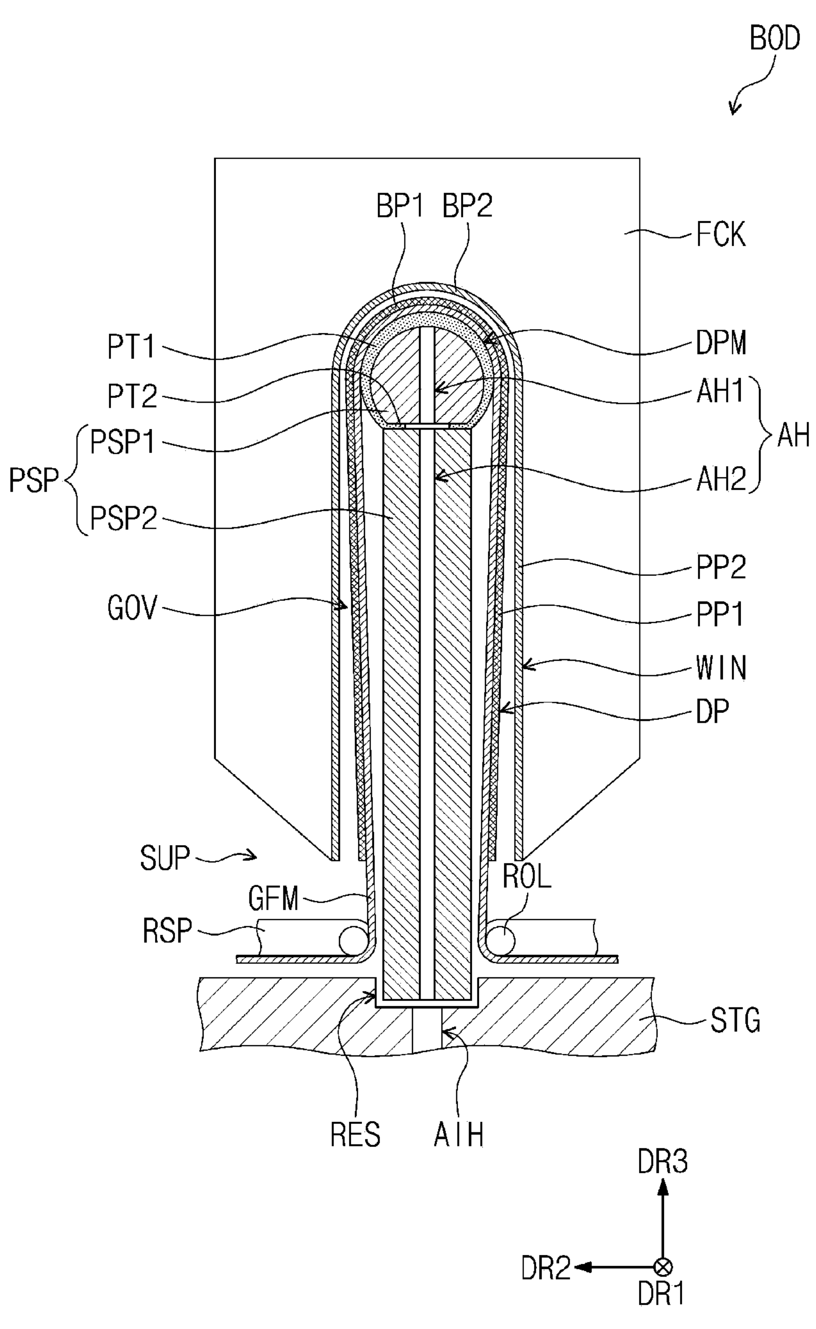

Referring to FIGS. 14 and 15, as the panel support PSP and the diaphragm DPM are disposed in the groove GOV, the display panel DP may be disposed on the groove GOV. The window fixing chuck FCK may be moved in the third direction DR3 so that the panel support PSP and the diaphragm DPM are disposed in the groove GOV.

However, an embodiment is not limited thereto. For example, the panel support PSP may be moved in the third direction DR3 so that the panel support PSP and the diaphragm DPM are disposed in the groove GOV. For example, the stage STG may be moved in the third direction DR3 so that the panel support PSP may be disposed in the groove GOV. Alternatively, the window fixing chuck FCK and the panel support PSP may be moved together in the third direction DR3 to be disposed adjacent to each other.

In a case that the panel support PSP and the diaphragm may be inserted into the groove GOV by moving the window fixing chuck FCK in the third direction DR3, the display panel DP and the window WIN may be spaced apart from each other so that the display panel DP may not be bonded to the window WIN by the adhesive ADH. Thus, the display panel DP may be spaced by a predetermined distance from the window WIN in the groove GOV. For example, a distance between the display panel DP and the window WIN may be in a range from about 0.3 mm to about 0.7 mm.

Figure 16:
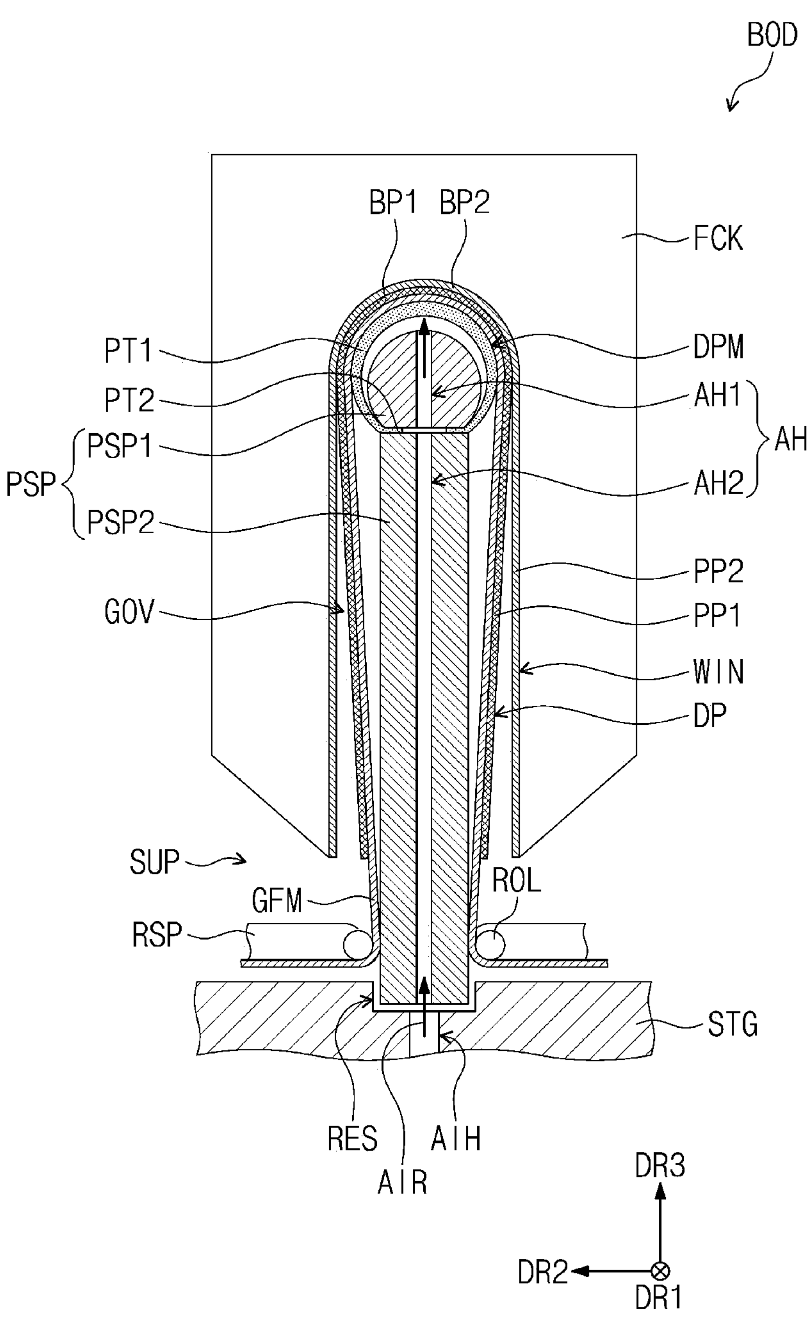

Referring to FIG. 16, air AIR may be injected to the air injection hole AIH, and the air AIR may be provided to the through-hole AH through the air injection hole AIH. The through-hole AH may define an air path through which the air AIR may be substantially moved. The air AIR may be injected into the first through-holes AH1 through the second through-hole AH2. The air AIR may be provided to the diaphragm DPM through the first through-hole AH1.

Although the air AIR may be provided to the through-hole AH through the air injection hole AIH, an embodiment is not limited thereto. For example, various gases including the air or various fluids may be provided to the through-hole AH through the air injection hole AIH.

The first portion PT1 of the diaphragm DPM may be expanded by the air AIR provided through the first through-hole AH1. Although the first portion PT1 is expanded, the second portion PT2 may not be separated from the panel support PSP because the second portion PT2 may be fixed between the first panel support PSP1 and the second panel support PSP2.

Since the second portion PT2 may be fixed, a lower portion of the first portion PT1 adjacent to the second portion PT2 may be relatively less expanded. However, in an embodiment, since the lower portion of the first portion PT1 adjacent to the second portion PT2 have a relatively smaller thickness than other portions of the first portion PT1, the lower portion of the first portion PT1 adjacent to the second portion PT2 may be easily expanded.

The expanded first portion PT1 may push the first bent portion BP1 of the display panel DP to the outside of the first panel support PSP1. The first bent portion BP1 may be moved toward the second bent portion BP2 of the window WIN adjacent to the first bent portion BP1 and bonded to the second bent portion BP2. For example, the first bent portion BP1 may be bonded to the second bent portion BP2 by the adhesive ADH disposed on the display panel DP.

Figure 17:
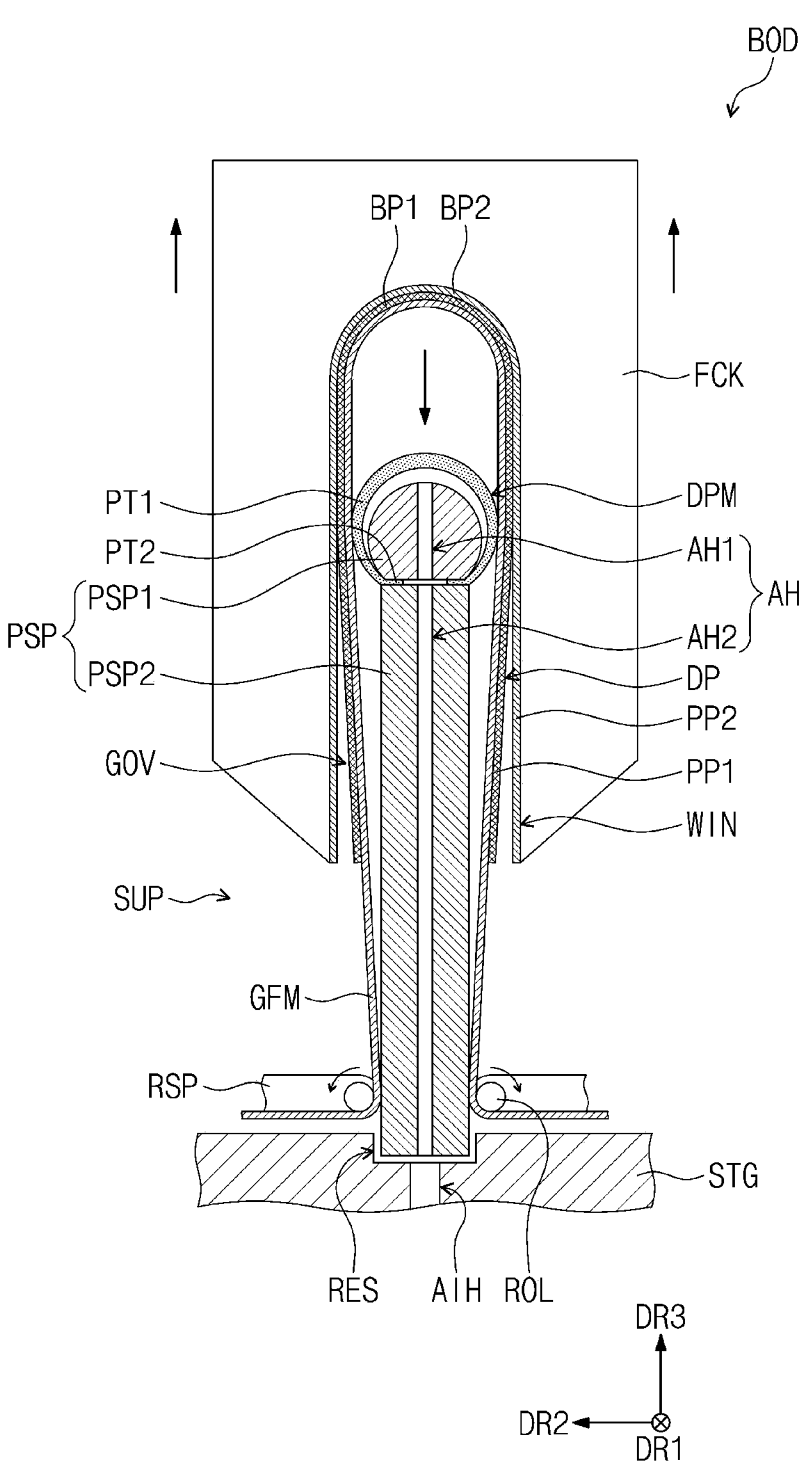

Referring to FIG. 17, the air AIR may be provided to the first portion PT1 through the air injection hole AIH and the through-hole AH. Thus, the first portion PT1 may maintain an expanded state.

The expanded first portion PT1 may be moved in the third direction DR3 to be spaced apart from the first and second bent portions BP1 and BP2 along the groove GOV. For example, the window fixing chuck FCK may be moved in the third direction DR3 to be spaced apart from the first portion PT1. However, an embodiment is not limited thereto. For example, the panel support PSP may be moved in the third direction DR3 to be spaced apart from the window fixing chuck FCK. Alternatively, the window fixing chuck FCK and the panel support PSP may be moved together in the third direction DR3 to be spaced apart from each other.

Since the first bent portion BP1 may be bonded to the second bent portion BP2, the first bent portion BP1 and a portion of the guide film GFM, which may be bonded to the first bent portion BP1, may not be moved in conjunction with the first portion PT1. Since the portion of the guide film GFM, which may be bonded to the first bent portion BP1, may be spaced apart from the first portion PT1, the guide film GFM may be provided in the third direction DR3 while the rollers ROL rotate.

The expanded first portion PT1 may push the first flat portions PP1 of the display panel DP to the outside of the second panel support PSP2. The first flat portions PP1 may be moved toward the second flat portions PP2 of the window WIN adjacent to the first flat portions PP1 and bonded to the second flat portions PP2. For example, the first flat portions PP1 may be bonded to the second flat portions PP2 by the adhesive ADH disposed on the display panel DP.

Although the expanded first portion PT1 may be moved until a middle portion of the groove GOV in the drawing, the expanded first portion PT1 may be moved to the outside of the groove GOV, and the entire first flat portions PP1 may be bonded to the second flat portions PP2. The first bent portion BP1 may be bonded to the second bent portion BP2 by the above-described operation of the bonding device BOD, and then the first flat portions PP1 may be bonded to the second flat portions PP2.

Although not shown, the display panel DP may be bonded to the window WIN, and then the guide film GFM may be separated from the display panel DP.

A pressure (hereinafter, referred to a first pneumatic pressure) of the air AIR provided to the first portion PT1 in a case that the first bent portion BP1 may be bonded to the second bent portion BP2 may be greater than a pressure (hereinafter, referred to a second pneumatic pressure) of the air AIR provided to the first portion PT1 in a case that the first flat portions PP1 may be bonded to the second flat portions PP2. However, an embodiment is not limited thereto. For example, the first pneumatic pressure may be equal to the second pneumatic pressure.

The first flat portions PP1 may be firstly bonded to the second flat portions PP2 in a case that bonded by inserting the bent display panel DP to the bent window WIN instead of using the bonding device BOD according to an embodiment. In this case, a bonding failure in which the first bent portion BP1 may not be bonded to the second bent portion BP2 may occur.

However, since the display panel DP may be sequentially bonded from the first bent portion BP1 to the first flat portions PP1 by the bonding device BOD in an embodiment, the display panel DP may be further easily bonded to the window WIN. Thus, the bonding failure between the display panel DP and the window WIN may be prevented.

Figure 18:
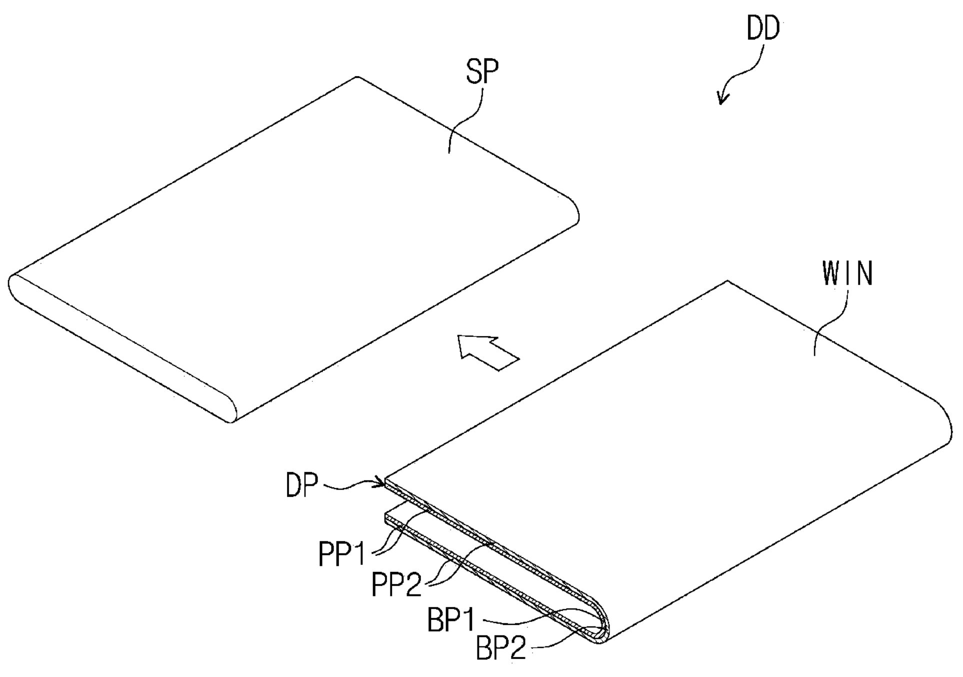
FIG. 18 is a view illustrating a support to be coupled with the display panel and the window.
Figure 19:
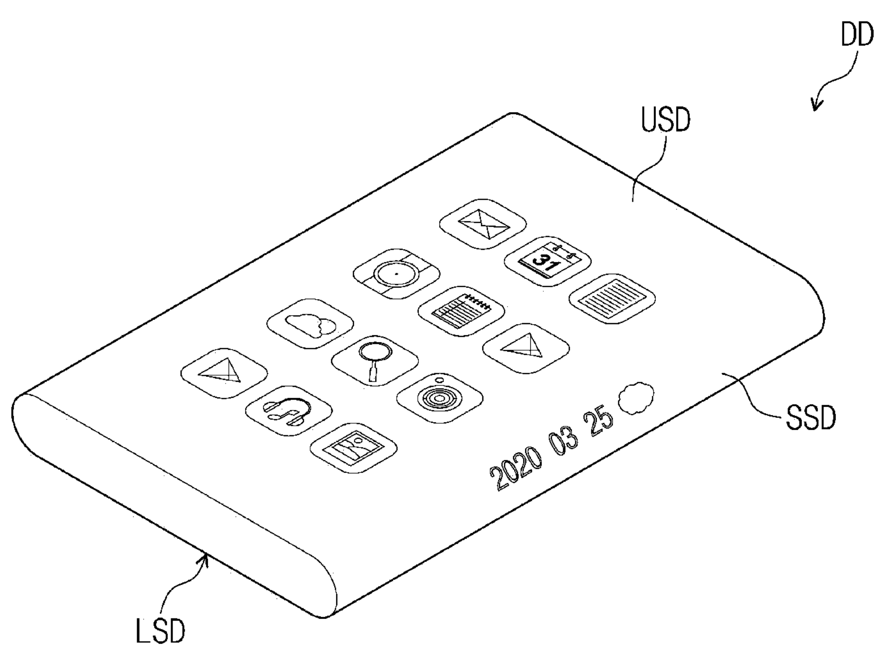
FIG. 19 is a view illustrating a display device manufactured by the display panel, the window, and the support, which are coupled to each other.

FIG. 18 is a view illustrating a support to be coupled with the display panel and the window. FIG. 19 is a view illustrating a display device manufactured by the display panel, the window, and the support, which are coupled to each other.

Referring to FIG. 18, the display panel DP and the window WIN, which are bonded to each other with a bent structure, may be coupled to a support SP. The support SP may be disposed between the first flat portions PP1 of the display panel DP. The support SP may include a bracket for supporting the display panel DP, a battery for supplying a power to the display panel DP, and a system board for controlling an operation of the display panel DP.

Referring to FIGS. 18 and 19, the first bent portion BP1 of the display panel DP may define a side display part SSD of a display device DD. The first flat portions PP1 of the display panel DP may define a front display part USD and a rear display part LSD of the display device DD.

Each of the front display part USD, the rear display part LSD, and the side display part SSD may display a predetermined image. For example, the front display part USD may display predetermined icons, and the side display part SSD may display a date and weather. However, this is merely an example. For example, each of the front display part USD and the side display part SSD may display various images. Although not shown in terms of the perspective view, the rear display part LSD may also display various images.

Hereinafter, various embodiments of the support will be described. Also, features of the supports according to various embodiments, which may be different from the above-described support SUP, will be mainly described, and the same components are indicated by the same reference numerals.

Figure 20:
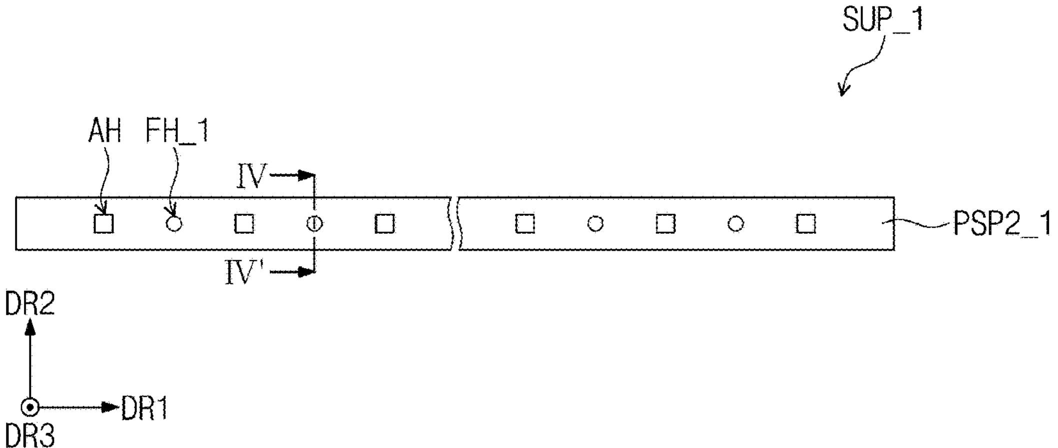
FIG. 20 is a view illustrating a configuration of a support according to an embodiment.
Figure 21:
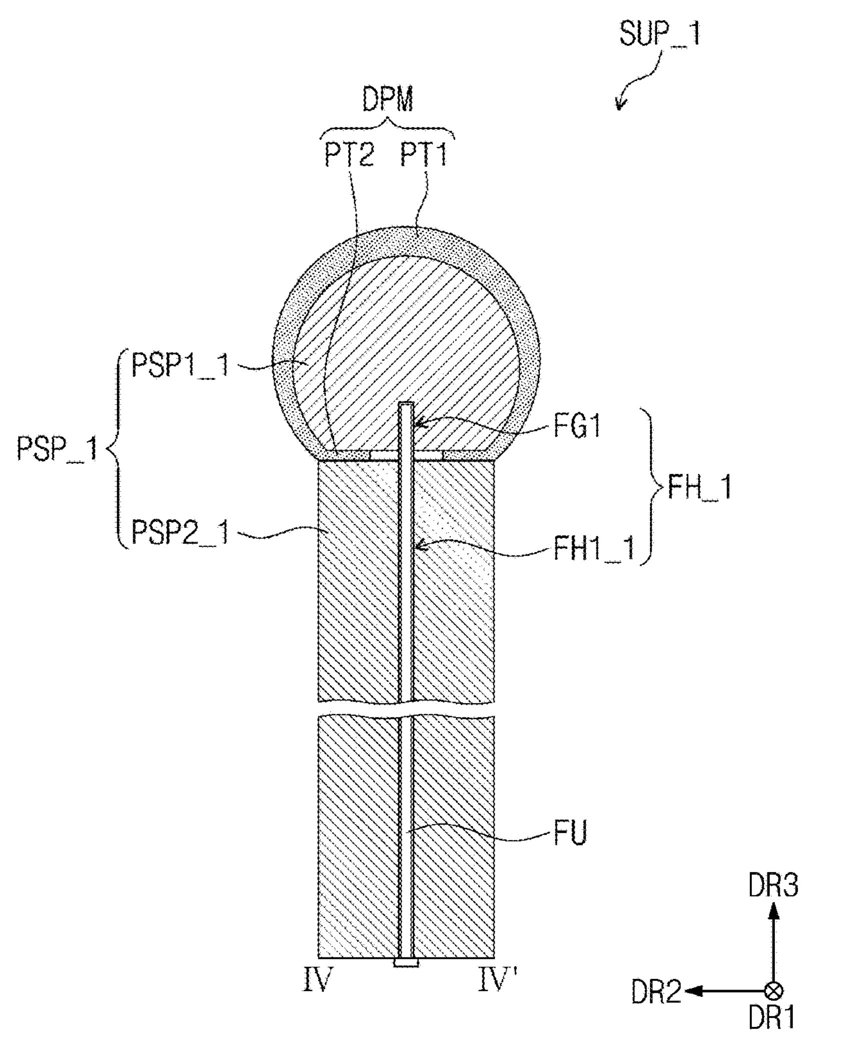
FIG. 21 is a schematic cross-sectional view taken along line IV-IV' of FIG. 20.

FIG. 20 is a view illustrating a configuration of a support according to an embodiment. FIG. 21 is a schematic cross-sectional view taken along line IV-IV' of FIG. 20.

As an example, a top surface of a second panel support PSP2_1 of a support SUP_1 is illustrated in FIG. 20, and a cross-section of the first panel support PSP1_1 and a diaphragm DPM are illustrated in conjunction with the second panel support PSP2_1 of the support SUP_1.

Referring to FIGS. 20 and 21, the support SUP_1 may include a panel support PSP_1 and the diaphragm DPM, and the panel support PSP_1 may include the first panel support PSP1_1 and the second panel support PSP2_1.

Fastening holes FH_1 may be arranged in the first direction DR1 and disposed between through-holes AH. The support SUP_1 may have the same configuration as the support SUP in FIGS. 5 to 8 except for positions of the fastening holes FH_1. Each of the fastening holes FH_1 may include a fastening groove FG1 defined or formed in the first panel support PSP1_1 and a first fastening hole FH1_1 defined or formed in the second panel support PSP2_1.

Fastening units FU may pass through the second panel support PSP2_1 and be inserted to the first panel support PSP1_1. As the fastening units FU are inserted to the first fastening hole FH1_1 and the fastening groove FG1, the second panel support PSP2_1 may be fastened to the first panel support PSP1_1. The fastening units FU in FIG. 21 may not pass through a second portion PT2 unlike the fastening units FU in FIG. 7.

The second portion PT2 of the diaphragm DPM may be disposed between the first panel support PSP1_1 and the second panel support PSP2_1 instead of overlapping the fastening holes FH_1. Each of the fastening units FU may have a screw structure and fasten the second panel support PSP2_1 to the first panel support PSP1_1.

In a case that the fastening units FU may be tightened while being inserted to the first fastening hole FH1_1 and the fastening groove FG1, the second panel support PSP2_1 may be moved toward the first panel support PSP1_1 to press the second portion PT2. Thus, the second portion PT2 may be fixed between the first panel support PSP1_1 and the second panel support PSP2_1 by the fastening units FU.

Figure 22:
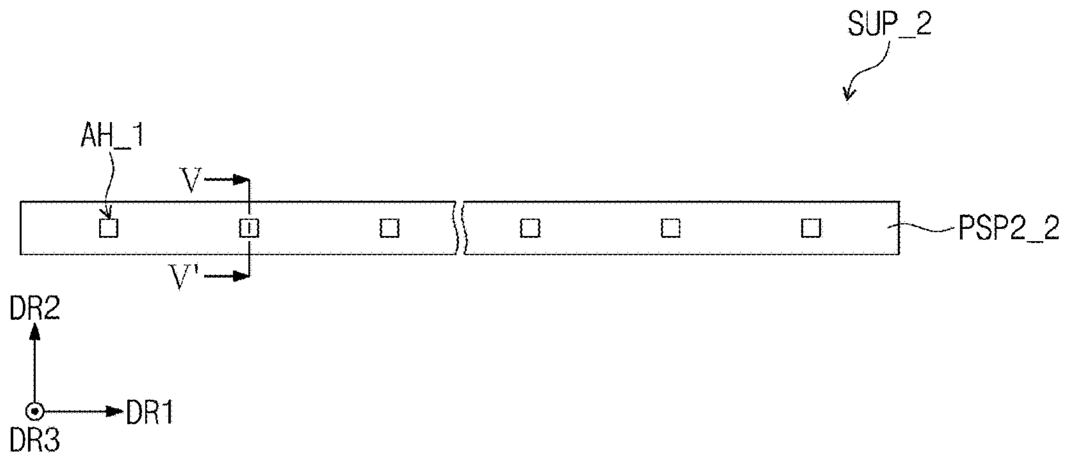
FIG. 22 is a view illustrating a configuration of a support according to an embodiment.
Figure 23:
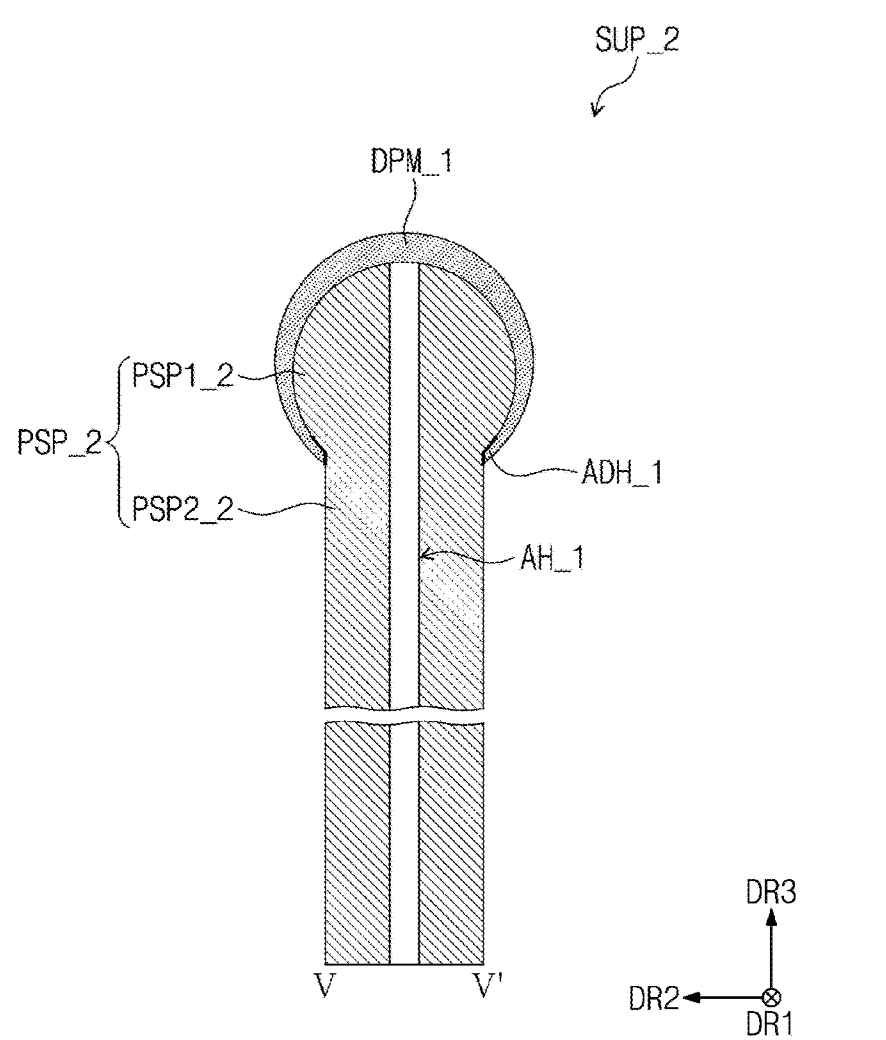
FIG. 23 is a schematic cross-sectional view taken along line V-V' of FIG. 22.

FIG. 22 is a view illustrating a configuration of a support according to an embodiment. FIG. 23 is a schematic cross-sectional view taken along line V-V' of FIG. 22.

As an example, a top surface of a second panel support PSP2_2 of a support SUP_2 is illustrated in FIG. 22, and a cross-section of the first panel support PSP1_2 and a diaphragm DPM are illustrated in conjunction with the second panel support PSP2_2 of the support SUP_2.

Referring to FIGS. 22 and 23, the support SUP_2 may include a panel support PSP_2 and a diaphragm DPM_1, and the panel support PSP_2 may include a first panel support PSP1_2 and a second panel support PSP2_2. Fastening hole FH may not be defined or formed in the first panel support PSP1_2 and the second panel support PSP2_2.

The first panel support PSP1_2 and the second panel support PSP2_2 may be integrated with each other or may be integral. Each of through-holes AH_1 may extend in the third direction DR3 and be continuously provided from the second panel support PSP2_2 to the first panel support PSP1_2.

The diaphragm DPM_1 may be connected between the first panel support PSP1_2 and the second panel support PSP2_2. For example, an adhesive ADH_1 may be disposed between the first panel support PSP1_2 and the second panel support PSP2_2, and a lower portion of the diaphragm DPM_1 may be bonded to a portion between the first panel support PSP1_2 and the second panel support PSP2_2.

Figure 24:
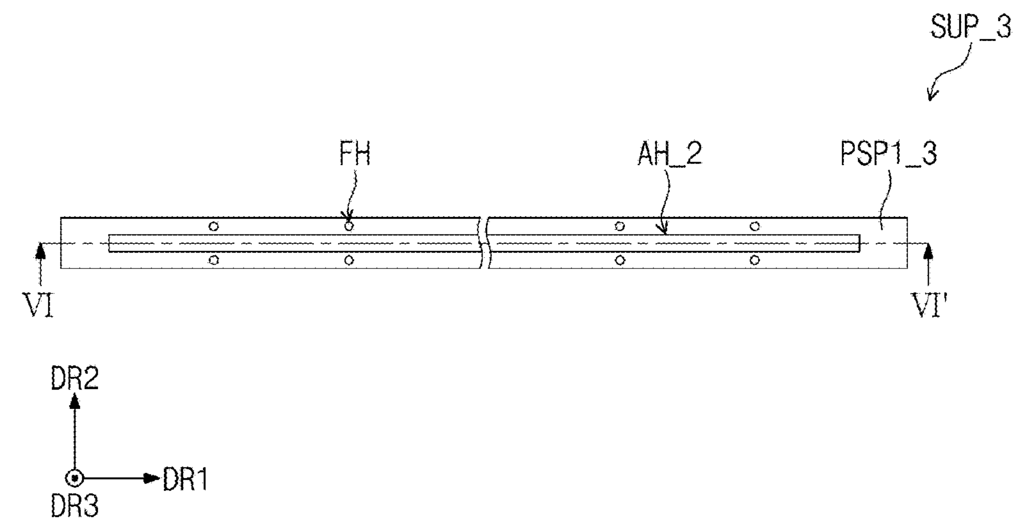
FIG. 24 is a view illustrating a configuration of a support according to an embodiment.
Figure 25:
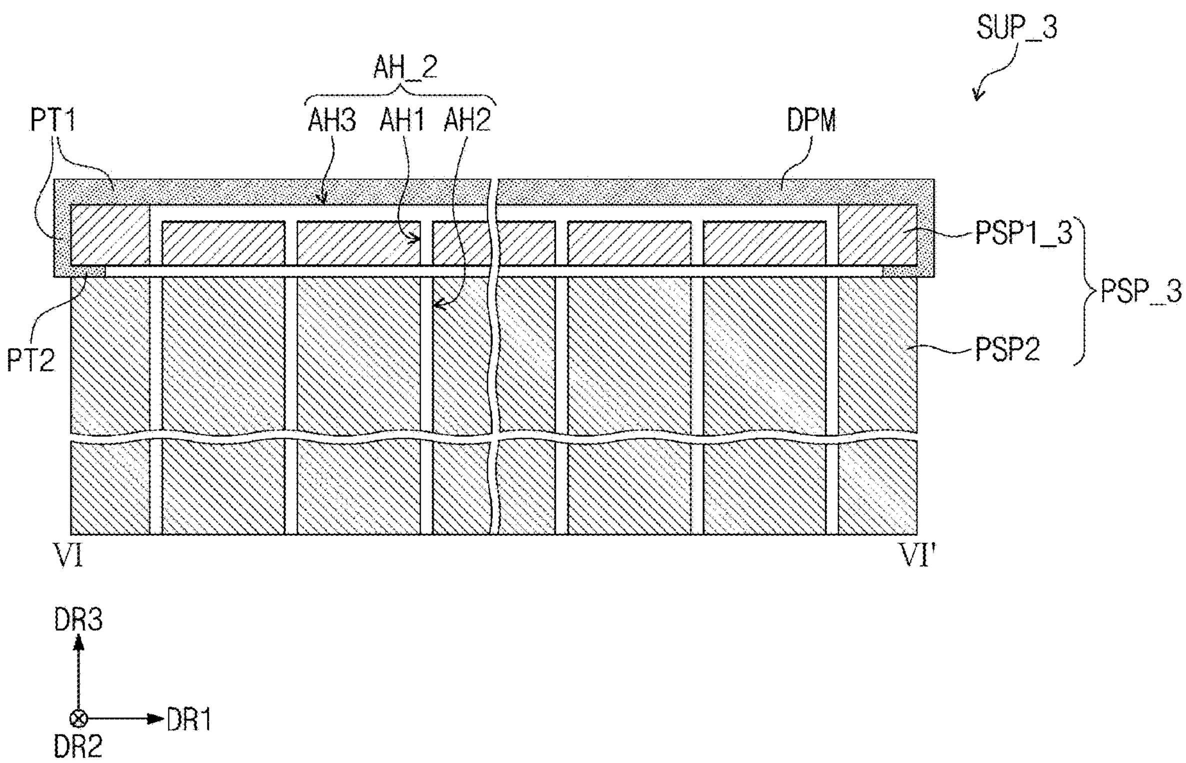
FIG. 25 is a schematic cross-sectional view taken along line VI-VI' of FIG. 24.

FIG. 24 is a view illustrating a configuration of a support according to an embodiment. FIG. 25 is a schematic cross-sectional view taken along line VI-VI' of FIG. 24.

As an example, a plan view of a first panel support PSP1_3 of a support SUP_3 is illustrated in FIG. 24, and a cross-section of the second panel support PSP2 and a diaphragm DPM are illustrated in conjunction with the first panel support PSP1_3 of the support SUP_3.

Referring to FIGS. 24 and 25, the support SUP_3 may include a panel support PSP_3 and the diaphragm DPM, and the panel support PSP_3 may include a first panel support PSP1_3 and a second panel support PSP2.

Each of through-holes AH_2 may extend from an upper end of the first panel support PSP1_3 in the first direction DR1. For example, the through-holes AH_2 may include first through-holes AH1 defined or formed in the first panel support PSP1_3, second through-holes AH2 defined or formed in the second panel support PSP2, and a third through-hole AH3 defined or formed in the first panel support PSP1_3. The third through-hole AH3 may be defined or formed in the upper end of the first panel support PSP1_3 and extend in the first direction DR1.

The first through-holes AH1 may be disposed below the third through-hole AH3 and extend from the third through-hole AH3 in the third direction DR3. For example, the first through-holes AH1 may share the third through-hole AH3.

Figure 26:
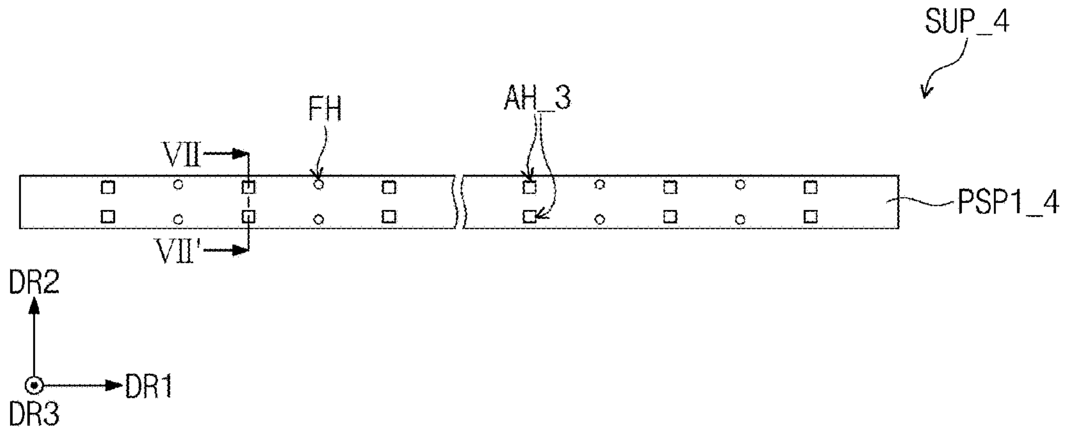
FIG. 26 is a view illustrating a configuration of a support according to an embodiment.
Figure 27:
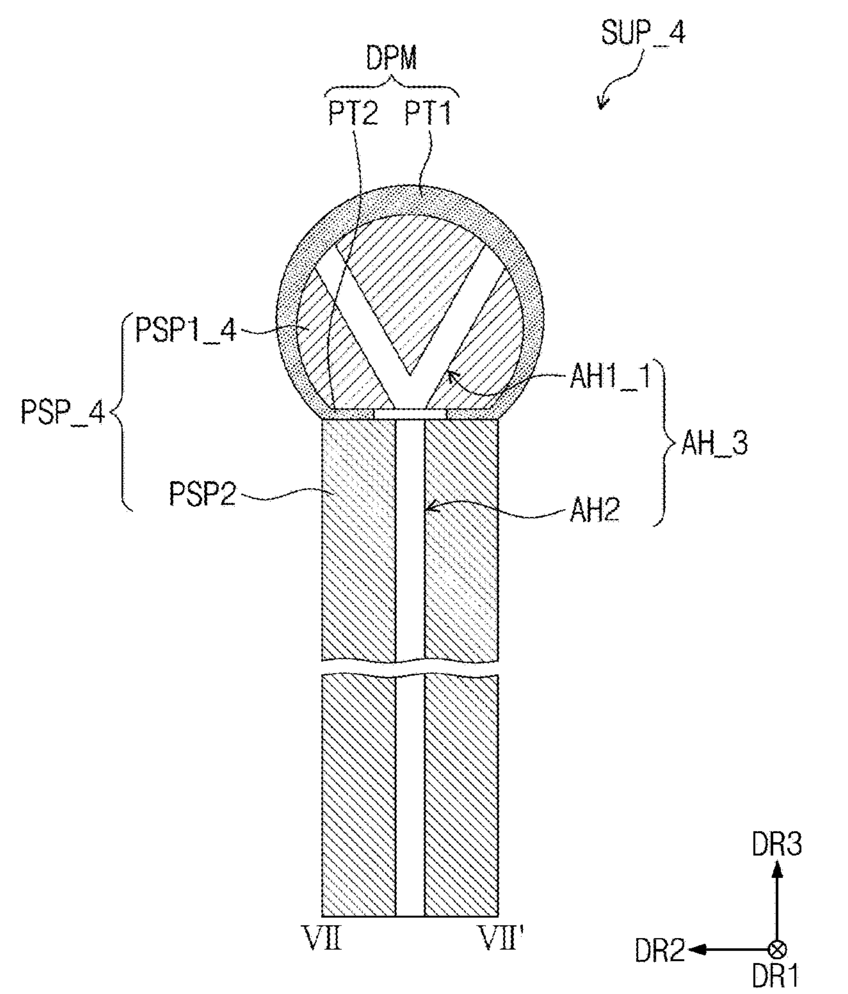
FIG. 27 is a schematic cross-sectional view taken along a line VII-VII' of FIG. 26.

FIG. 26 is a view illustrating a configuration of a support according to an embodiment. FIG. 27 is a schematic cross-sectional view taken along line VII-VII' of FIG. 26.

As an example, a plan view of a first panel support PSP1_4 of a support SUP_4 is illustrated in FIG. 26, and a cross-section of a second panel support PSP2 and a diaphragm DPM are illustrated in conjunction with the first panel support PSP1_4 of the support SUP_4.

Referring to FIGS. 26 and 27, the support SUP_4 may include a panel support PSP_4 and the diaphragm DPM, and the panel support PSP_4 may include a first panel support PSP1_4 and a second panel support PSP2.

Each of through-holes AH_3 may include first through-holes AH1_1 defined or formed in the first panel support PSP1_4 and a second through-hole AH2 defined or formed in the second panel support PSP2. The first through-holes AH1_1 may be opened through a curved surface of the first panel support PSP1_4. Lower portions of the first through-holes AH1_1 may define an integrated space or aperture or cavity to overlap the second through-hole AH2. The first through-holes AH1_1 may be formed continuously from the second through-hole AH2. Although two first through-holes AH1_1 are illustrated, an embodiment is not limited to the number of the first through-holes AH1_1.

Figure 28:
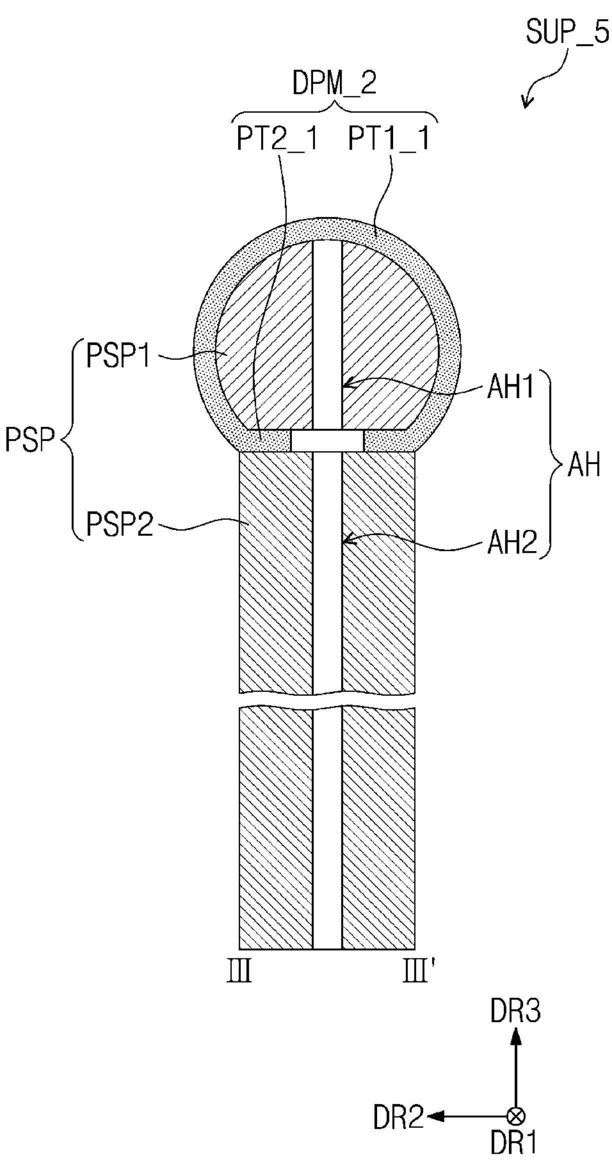
FIG. 28 is a view illustrating a configuration of a support according to an embodiment.

FIG. 28 is a view illustrating a configuration of a support according to an embodiment.

As an example, FIG. 28 illustrates a cross-section corresponding to FIG. 8.

Referring to FIG. 28, a support SUP_5 may include a panel support PSP and a diaphragm DPM_2, and the diaphragm DPM_2 may include a first portion PT1_1 and a second portion PT2_1. The diaphragm DPM_2 may have a thickness that may be constant from an upper end of a first panel support PSP1 to a portion between a first panel support PSP1 and a second panel support PSP2. The first portion PT1_1 may have the same thickness as the second portion PT2_1.

Figure 29:
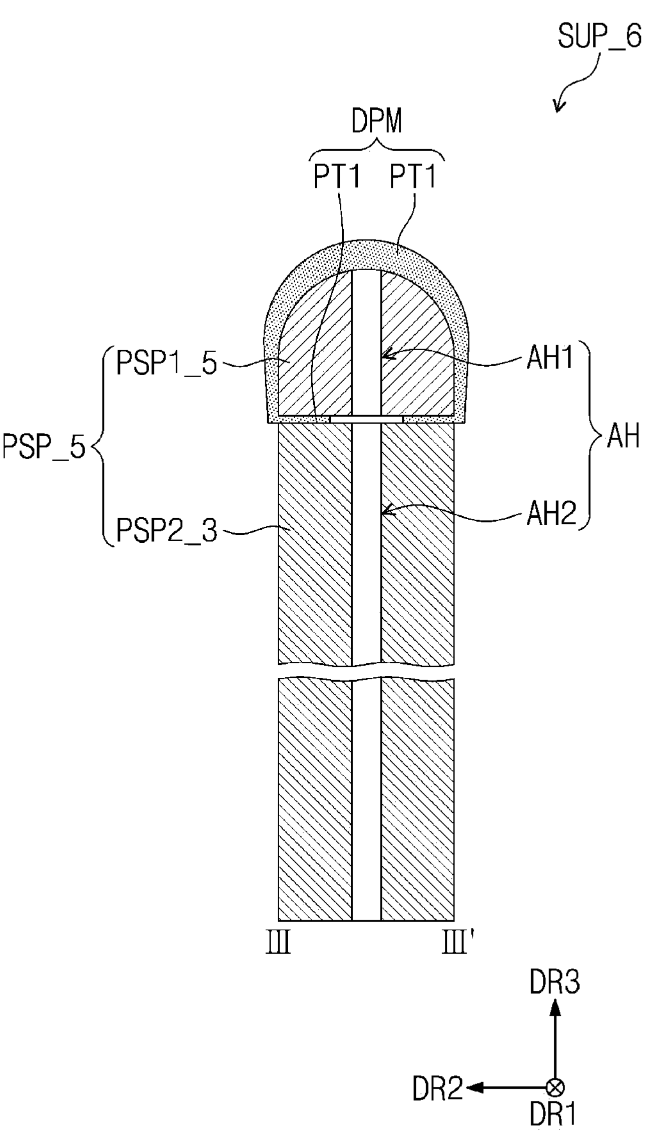
FIG. 29 is a view illustrating a configuration of a support according to an embodiment.

FIG. 29 is a view illustrating a configuration of a support according to an embodiment.

As an example, FIG. 29 illustrates a cross-section corresponding to FIG. 8.

Referring to FIG. 29, a support SUP_6 may include a panel support PSP_5 and a diaphragm DPM, and the panel support PSP_5 may include a first panel support PSP1_5 and a second panel support PSP2_3. The first panel support PSP1_5 may have a maximum width equal to a width of the second panel support PSP2_3 in terms of or based on the second direction DR2.

According to an embodiment, the first bent portion of the display panel may be bonded to the second bent portion of the window, which may be adjacent to the first bent portion, and then the first flat portion of the display panel may be bonded to the second flat portion of the window, which may be adjacent to the first flat portion. Thus, the bonding failure between the first bent portion and the second bent portion may be prevented.

Although embodiments of the disclosure have been described, it is understood that the disclosure should not be limited to these embodiments but various changes and modifications may be made by one of ordinary skill in the art within the spirit and scope of the disclosure as hereinafter claimed. Thus, the scope of the disclosure is to be determined by the broadest permissible interpretation of the following claims and their equivalents, and shall not be restricted or limited by the foregoing detailed description.

What is claimed is:

1. A method of manufacturing a display device, the method comprising:

disposing a display panel on a diaphragm that overlaps an upper portion of a panel support and side surfaces of the panel support;

disposing a window in a groove of a window fixing chuck, the window fixing chuck being disposed above the diaphragm;

disposing the panel support and the diaphragm in the groove of the window fixing chuck;

bonding a first bent portion of the display panel disposed on the diaphragm to a second bent portion of the window adjacent to the first bent portion of the display panel by expanding the diaphragm; and bonding first flat portions of the display panel disposed on the side surfaces of the panel support to second flat portions of the window adjacent to the first flat portions of the display panel by moving the expanded diaphragm along the groove of the window fixing chuck, such that the expanded diaphragm is spaced apart from the first bent portion of the display panel, wherein the moving of the expanded diaphragm presses the first flat portions of the display panel and the second flat portions of the window to form a bond.

2. The method of claim 1, further comprising:

expanding the diaphragm by air injected through a through-hole formed in the panel support.

3. The method of claim 2, wherein a first pneumatic pressure supplied to the diaphragm when the first bent portion of the display panel is bonded to the second bent portion of the window is greater than a second pneumatic pressure supplied to the diaphragm when the first flat portions of the display panel are bonded to the second flat portions of the window.

4. The method of claim 2, wherein the panel support comprises:

a first panel support; and a second panel support disposed below the first panel support, wherein the diaphragm is disposed on the first panel support and extends along the first panel support, the diaphragm is disposed between the first panel support and the second panel support, and the through-hole extends from the second panel support to the first panel support, and the diaphragm is disposed on the through-hole formed in the first panel support.

5. The method of claim 4, wherein the diaphragm is not disposed on side surfaces of the second panel support, and a thickness of the diaphragm gradually decreases from an upper end of the first panel support to a portion between the first panel support and the second panel support.

* * * * *